US009632413B2

(12) United States Patent
Saenger et al.

(10) Patent No.: US 9,632,413 B2
(45) Date of Patent: Apr. 25, 2017

(54) APPARATUS AND METHOD FOR COMPENSATING A DEFECT OF A CHANNEL OF A MICROLITHOGRAPHIC PROJECTION EXPOSURE SYSTEM

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 342 days.

(21) Appl. No.: 14/466,053

(22) Filed: Aug. 22, 2014

(65) Prior Publication Data
US 2015/0017589 A1    Jan. 15, 2015

Related U.S. Application Data

(63) Continuation of application No. PCT/EP2012/055621, filed on Mar. 29, 2012.

(51) Int. Cl.
G03B 27/54 (2006.01)
G03B 27/72 (2006.01)
G03F 7/20 (2006.01)
G02B 5/30 (2006.01)

(52) U.S. Cl.
CPC ......... *G03F 7/2006* (2013.01); *G02B 5/3083* (2013.01); *G03F 7/20* (2013.01); *G03F 7/70116* (2013.01); *G03F 7/70191* (2013.01); *G03F 7/70425* (2013.01); *G03F 7/70566* (2013.01)

(58) Field of Classification Search
CPC ............ G03F 7/70966; G03F 7/70116; G03F 7/70425; G03F 7/70566
USPC .............................................. 355/53, 67–71
See application file for complete search history.

(56) References Cited

U.S. PATENT DOCUMENTS

| 6,191,880 | B1 | 2/2001 | Schuster |
| 7,525,639 | B2 | 4/2009 | Yamada |
| 8,537,332 | B2 | 9/2013 | Freimann |
| 8,593,618 | B2 | 11/2013 | Totzeck |
| 8,711,479 | B2 | 4/2014 | Fiolka et al. |

(Continued)

FOREIGN PATENT DOCUMENTS

| CN | 1914525 A | 2/2007 |
| CN | 101589343 A | 11/2009 |

(Continued)

OTHER PUBLICATIONS

Japanese Office Action, with translation thereof, for JP Appl No. 2015-502109, dated Mar. 7, 2016.

(Continued)

*Primary Examiner* — Hung Henry Nguyen
(74) *Attorney, Agent, or Firm* — Fish & Richardson P.C.

(57) ABSTRACT

The invention relates to an illumination system of a microlithographic projection exposure apparatus comprising (a) a plurality of channels, each channel guiding a partial beam and at least one channel comprising at least one defect, and (b) at least one optical element arranged within the at least one channel having the at least one defect, the optical element being adapted to at least partially compensate the at least one defect of the partial beam of the channel.

28 Claims, 11 Drawing Sheets
(2 of 11 Drawing Sheet(s) Filed in Color)

(56) References Cited

U.S. PATENT DOCUMENTS

| | | | |
|---|---|---|---|
| 8,724,086 | B2 | 5/2014 | Layh et al. |
| 9,116,439 | B2* | 8/2015 | Mulder ............... G03F 7/70116 |
| 2004/0108167 | A1 | 6/2004 | Elliott |
| 2005/0007573 | A1 | 1/2005 | Hansen et al. |
| 2005/0094268 | A1* | 5/2005 | Fiolka ................ G02B 27/0994 |
| | | | 359/489.05 |
| 2005/0146704 | A1 | 7/2005 | Gruner et al. |
| 2006/0139612 | A1 | 6/2006 | Wagner et al. |
| 2007/0058274 | A1 | 3/2007 | Singer et al. |
| 2007/0146676 | A1 | 6/2007 | Tanitsu et al. |
| 2007/0279613 | A1 | 12/2007 | Fiolka et al. |
| 2009/0027646 | A1* | 1/2009 | Fiolka ................ G03F 7/70966 |
| | | | 355/67 |
| 2009/0040496 | A1 | 2/2009 | Gruner et al. |
| 2010/0002209 | A1 | 1/2010 | Kawashima et al. |
| 2010/0165318 | A1 | 7/2010 | Fiolka et al. |
| 2012/0081686 | A1 | 4/2012 | Kohl |
| 2015/0241792 | A1 | 8/2015 | Mulder et al. |

FOREIGN PATENT DOCUMENTS

| | | | |
|---|---|---|---|
| CN | 101802715 A | | 8/2010 |
| CN | 101946212 A | | 1/2011 |
| CN | 102200693 A | | 9/2011 |
| EP | DE 10 2004 011 A1 733 | | 9/2005 |
| EP | 1 879 071 A2 | | 1/2008 |
| EP | 2369413 | | 9/2011 |
| JP | 2000-331927 | | 11/2000 |
| JP | 2006-173305 A | | 6/2006 |
| JP | 2007-500432 | | 1/2007 |
| JP | 2011-199285 | | 10/2011 |
| JP | 2014-139677 A | | 7/2014 |
| WO | WO 2005/026843 A2 | | 3/2005 |
| WO | WO 2005/031467 A2 | | 4/2005 |
| WO | WO 2005/069081 A2 | | 7/2005 |
| WO | WO 2008/019936 A2 | | 2/2008 |
| WO | WO 2009/034109 A2 | | 3/2009 |
| WO | WO 2009/100862 A1 | | 8/2009 |
| WO | WO 2009/152867 A1 | | 12/2009 |

OTHER PUBLICATIONS

International Search Report for corresponding PCT Appl No. PCT/EP2012/055621, dated Jan. 8, 2013.

M. Totzeck et al., "Polarization influence on imaging", J. Microlith., Microlab., Microsyst., 4(3) (Jul.-Sep. 2005), p. 031108-1-031108-15.

International Preliminary Report on Patentability for corresponding PCT Appl No. PCT/EP2012/055621, dated Oct. 9, 2014.

Chinese Office Action, with translation thereof, for CN Appl No. 2012800719752, dated Jul. 27, 2015.

* cited by examiner

APPARATUS AND METHOD FOR COMPENSATING A DEFECT OF A CHANNEL OF A MICROLITHOGRAPHIC PROJECTION EXPOSURE SYSTEM

CROSS-REFERENCE TO RELATED APPLICATIONS

The present application is a continuation of, and claims benefit under 35 USC 120 to, international application PCT/EP2012/055621, filed Mar. 29, 2012. The entire disclosure of this application is incorporated by reference herein.

FIELD OF THE INVENTION

The present invention relates to the field of compensating a defect of a channel of a microlithographic projection exposure system.

BACKGROUND OF THE INVENTION

Microlithographic projection exposure systems are used for the production of microstructured components, in particular semiconducting components such as integrated circuits (ICs). A microlithographic projection exposure system comprises as essential components a light source, an illumination device or illumination system and a projection objective or a projection system. In modern projection exposure systems which use electromagnetic radiation of the deep ultraviolet (DUV) wavelength range, the light source is typically an excimer laser system (a krypton fluoride (KrF) excimer laser for the 248 nm, an argon fluoride (ArF) laser for the 193 nm, or a fluoride (F2) excimer laser for the 157 nm wavelength).

The properties of the illumination system determine the imaging quality and the wafer throughput which can be achieved with the microlithographic projection exposure system. The illumination system has to be capable of forming a light beam from the light source for various possible illumination modes or settings. Various settings as for example an annular field illumination and/or dipole or quadrupole off-axis illuminations having different degrees of coherence are used for generating an optimal imaging contrast of the structure elements of the photolithographic mask in the photosensitive layer arranged on a substrate. At the same time, the projection exposure system has to have a reasonable process window. For example, off-axis oblique illuminations can be used in order to increase the depth of focus (DoF) via a two-beam interference and also to increase the resolving power of the overall system.

The illumination system has to generate the various settings with the highest efficiency as the effort and cost drastically increase for the generation of electromagnetic radiation with decreasing wavelength, in particular in the DUV wavelength range. Furthermore, it is mandatory that the optical intensity distribution is as uniform as possible across the illumination mode since any inhomogenity reduces the critical dimension (CD) of the feature elements which are to be imaged on a substrate.

In order to fulfil these requirements, the optical beam of the light source is separated or split into a number of partial beams which are individually shaped and/or directed in various channels by micro-structured optical components within the optical illumination system. Microlithographic illumination systems which use different principles for splitting and guiding the partial beams are for example disclosed in the US 2004/0 108 167 A1 and the WO 2005/026 843 A2.

The term "channel" means here and in the following a volume within the illumination system through which a partial beam travels from the location where it is generated by splitting of the input beam to the location where it is superimposed or combined with other partial beams.

The projection objective of the microlithographic projection exposure system collects the light transmitted through the mask and focuses it onto a photosensitive layer or photoresist dispensed on a substrate which is arranged in the focus plane of the projection objective. The substrate is often a semiconducing wafer, as for example a silicon wafer.

As a result of the constantly increasing integration density in the semiconductor industry, photolithographic projection exposure systems have to project smaller and smaller structures onto the photoresist. In order to fulfil this demand, as already mentioned, the exposure wavelength of projection exposure systems has been shifted from the near ultraviolet across the mean ultraviolet into the deep ultraviolet region of the electromagnetic spectrum. Presently, a wavelength of 193 nm is typically used for the exposure of the photoresist on wafers. As a consequence, the manufacturing of microlithographic projection exposure systems with increasing resolution is becoming more and more complex, and thus more and more expensive as well. In the future, projection exposure systems will use significantly smaller wavelengths in the extreme ultraviolet (EUV) wavelength range of the electromagnetic spectrum (e.g. in the range of 10 nm-15 nm).

At a given wavelength the resolution of a projection exposure system can be augmented by increasing the numerical aperture (NA) of its projection system. M. Totzeck et al. discuss in the article "Polarization influence on imaging", J. Microlith., Microlab., Microsyst., 4(3) (July-September 2005), p. 031108-1-031108-15) that for high NA projection systems the polarization of the illumination beam has a significant influence on the resolution of a projection exposure system.

Therefore, in order to be able to control the degree of coherence of the optical beam exiting a microlithographic illumination system, it is necessary to control its polarization state. Various approaches are already known for adjusting a predetermined polarization distribution in the pupil plane and/or in the mask plane of the illumination system as well as in the projection system in order to optimize the image contrast. Some not exhaustive examples are listed in the following: WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, EP 1 879 071 A2, and DE 10 2004 011 733 A1

The documents mentioned above describe a control of the polarization of the overall beam or of some sub-beams comprising many partial beams of individual channels of the illuminations system. On the other hand, there may be defects as for example polarization defects of individual partial beams caused by defective or weak optical components within individual channels. The superposition of partial beams where one or several partial beams may have a changed or even an indefinite polarization state can lead to an unpredictable polarization state of the overall beam. This situation results in a reduction of the intensity in preferred state (IPS) which may fall below a predetermined threshold.

It is therefore one object of the present invention to provide an apparatus and a method for compensating defects of partial beams within the channel of the partial beams.

SUMMARY OF THE INVENTION

According to a first aspect of the invention, an illumination system of a microlithographic projection exposure apparatus comprises (a) a plurality of channels, each channel guiding a partial beam and at least one channel comprising at least one defect, and (b) at least one optical element arranged within the at least one channel having the at least one defect, the optical element being adapted to at least partially compensate the at least one defect of the partial beam of the channel.

By compensating a defect within a channel of a partial beam, it is avoided that the local defect of a partial beam may deteriorate the quality of the beam formed by a superposition of several of the partials beams exiting the illumination system to illuminate the mask. In particular, the superposition of several well behaved partial beams and a single defective partial beam may result in an impairment of a second quantity of the overall optical beam exiting the illumination system. Such an impairment may lead to complex correction measures for the illumination beam(s) of an illumination system.

Since the optical element only minimally affects the beam characteristics of the partial beam in the respective channel, the insertion of the optical element does not require compensative measures for the partial beam. On the other hand, the compensation of the defect effectively increases the intensity in preferred state (IPS) of the beam(s) exiting the illumination system.

In a further aspect, the at least one defect comprises a variation of the polarization of the partial beam in the at least one channel. In another aspect, the at least one optical element at least partially compensates the at least one defect by modifying a polarization of the partial beam.

One example of a defect in a channel of an illumination system is a variation of the polarization of the partial beam. Sources for such a polarization variation may be reflection and/or transmission at interfaces and coatings and/or a birefringence of optical components in the channel of the optical beam. Birefringence may be intrinsic or material birefringence and/or may be induced by a strain caused by the mounting of the optical component. By selectively modifying the polarization of a partial beam, the variation of the polarization can at least partially be compensated.

According to a further aspect, the at least one optical element comprises a strain induced birefringence which at least partially compensates the variation of the polarization of the partial beam. In another beneficial effect, the strain induced birefringence comprises introducing at least one arrangement of local persistent modifications in an area of the optical element outside of its optically relevant area.

It is well known that the introduction of a local deformation in a transparent material causes a local strain induced birefringence variation. Based on a model which describes an induced local deformation as a function the parameters of the laser beam used for the introduction of the local deformation, the strain distribution which is locally induced in a material of an optical element can be controlled. Therefore, a predetermined local strain distribution can be introduced in the optical element. This strain distribution results in a respective birefringence distribution.

In a preferred embodiment, one or several arrangements of local persistent modifications are introduced in an area of the optical element which is optically not relevant. The far reaching strain components extend in the optically relevant area of the optical element and cause a strain induced birefringence distribution which at least partially compensates the optical defect in the respective channel. The arrangement of local persistent modifications can be calculated from the required birefringence distribution with the aid of a computer system.

The configuration in which the arrangement(s) of local persistent modifications are introduced in an area outside of the optically relevant area of the optical element has the advantage that the arrangement of local persistent modifications cannot have an impact on photons of the partial beam. Moreover, the arrangement of local persistent modifications cannot degrade the optical properties of the optically relevant area of the optical element.

The term "essentially" means in this description a variation of a quantity which is below the resolution limit of state of the art measurement technique.

The optically relevant area of an optical element is the area through with a beam or a partial beam traverses the optical element or from which a beam or a partial beam is reflected. The optically not relevant area is given by all other area portions of the optical element.

In a further aspect, a mirror of a two-dimensional mirror array directs a partial beam passing through the at least one optical element in an outer edge of a pupil in agreement with a predetermined target pupil.

The retardation caused by the birefringence shows a symmetrical variation across the beam within the pupil plane. It increases from the pupil centre toward the pupil edge. Thus, by directing the partial beam or the partial beams traversing the at least one optical element and thus having acquired a defined retardation toward the pupil edge, the retardation in the pupil edge can be compensated. This process has to take the constraint into account that the intensity distribution in the pupil plane has to fulfil a predetermined target distribution. However, it is not necessary that the defect in the pupil plane comprises a symmetric variation across the pupil in order to be compensated in the defined illumination system.

According to a further beneficial aspect, the strain induced birefringence of the at least one optical element comprises a fast axis having a fixed direction.

Introducing a strain induced birefringence in the optical element having a fast axis with a fixed direction allows a space-resolved correction of the polarization variation.

In another aspect, the strain induced birefringence of the at least one optical element comprises a retardation in the optical relevant area of the at least one optical element of 1 nm-10 nm, preferably 2 nm-8 nm, and most preferably 3 nm-6 nm.

In another preferred aspect, the at least one optical element maximizes a modification of the polarization of the partial beam by selecting an orientation of the fast axis of the at least one optical element with respect to a polarisation of the partial beam in the channel.

The described optimization process is easily performed if the partial beam has a linear polarization and the optical element has a fast axis with a fixed direction. However, the defect compensation can also be performed if the partial beam has an arbitrary polarization and the strain induced birefringence does not generate a fixed fast axis.

In another beneficial aspect, the illumination system is adapted to superimpose partial beams of at least one first channel and at least one second channel in a single spot, so that the retardation of the superimposed partial beams compensates the retardation of the illumination system.

This feature is advantageous as it allows compensating defects of several channels whose partial beams superimpose in a single spot to form an illumination beam exiting the illumination system by inserting a specifically designed optical element in one of the channels of the partial superimposed beams. Consequently, the defect compensation of a multitude of channels where some or all of the channels have a defect is simplified to a large extent.

In a further aspect, the polarization of the partial beam of the at least one first channel is rotated by a predetermined amount with respect to the polarization of the partial beam of the at least one second channel.

According to a further aspect, the compensation of the at least one defect increases an intensity in preferred state of a beam exiting the illumination system.

The intensity in preferred state (IPS) is an important characteristic for the imaging quality of a projection exposure system. The IPS is therefore defined by a threshold value (e.g. IPS >97%) which restricts the loss of usable photons to a very low percentage.

In another aspect, the at least one optical element is adapted to comprise an actuator to induce strain in the optically relevant area of the at least one optical element. In a further aspect, the actuator comprises a piezo-electric element.

By combining the optical element with an actuator, a temporarily changing strain can be applied to the optical element which allows a rapid adaptation of the birefringence to a new situation. The actuator may change the retardation leaving the fast axis untouched, or it may be arranged to modify both, the orientation of the fast axis and the retardation. It is also conceivable to arrange two or more actuators to the optical element.

According to another aspect, the at least one optical element is adapted to be dynamically inserted in the at least one channel during an operation of the illumination system.

This feature enables an optimization of the IPS of the projection exposure system during its operation. It requests that the optical element does neither essentially vary the optical intensity of the partial beam nor change its phase relationship.

In still a further aspect, the at least one optical element comprises a multitude of optical elements being fabricated with different fixed fast axes and/or different amounts of retardations.

For example, there may be defects in a channel of a microlithographic illumination system having various amounts of material birefringence. Therefore, it may be favourable to generate optical elements having various arrangements of local persistent modifications which are adapted to the different defects occurring in the channels of the illumination system.

According to another aspect, the multitude of optical elements is adapted to be inserted in a multitude of channels each one having a defect so that the intensity in preferred state of a beam exiting the illumination system is maximized.

The microlithographic illumination system has a multitude of channels. Therefore, it is possible that more than one channel has a defect. The defect in two or more channels may have essentially the same defect amount or the defects of the different channels may have different defect amounts. These defects can be compensated by inserting optical elements in the respective defective channels which best compensate the respective defect. The defect compensation is controlled by the IPS of the superimposed partial beams.

In another aspect, the at least one optical element is adapted to comprise a polarizer which changes the polarization of the partial beam by a predetermined amount.

By introducing an arrangement of local persistent modifications in an area optically not used by the polarizer, the polarizer can perform a predetermined polarization manipulation at the partial beam and can simultaneously compensate a defect caused by a polarization variation within the channel. Such a configuration may save space in the channels of the microlithographic illumination system.

In a further aspect, the at least one optical element comprises a mirror for reflecting the partial beam. According to yet another aspect, the at least one optical element comprises a lens for deflecting the partial beam.

As already mentioned, a micolithographic illumination system typically comprises many different channels each one guiding a partial beam. Consequently, there is often less space between the various partial beams. It may therefore be beneficial to combine the defect compensation with a further function of an optical element in order to save space in the illumination system.

It is also conceivable to combine the just discussed approach with the insertion of one or more optical elements specifically designed for the defect compensation in a channel. It can be beneficial to add a predetermined amount of defect compensation to optical elements of the specific channels as for example channels close to the edges and/or corners of the channel matrix and insert additional optical elements only to a few channels having a specific defect.

According to another aspect, the at least one optical element is adapted to comprise at least one plate having at least two optically relevant areas for at least two channels, the optically relevant areas are arranged between areas of the at least one plate which are optically not relevant.

As the channel arrangement of a microlithographic illumination system typically comprises many channels, there may be situations in which it is cumbersome to individually compensate defects in a number of channels. This approach of the defect compensation of individual channels may be limited due to space restrictions if a number of adjacent channels of the channel arrangement have a defect. Therefore, it may be useful to generate a plate which can compensate defects of a number of channels.

In still another aspect, the at least two optically relevant areas are arranged in a one-dimensional row or a two-dimensional rectangular matrix, the at least two optically relevant areas have a diameter which is adjusted to a diameter of the partial beams, and the at least two optically relevant areas have a distance which is adjusted to a distance between the partial beams of the at least two different channels.

In a further aspect, the plate comprises at least one optically relevant area being adapted to at least partially compensate the at least one defect and at least one optical relevant area not having a strain induced birefringence.

Similar to an optical element for a single channel, a plate may integrate various functions as for example defect compensation and generating a predetermined polarization variation.

In still another aspect, the plate comprises at least two optically relevant areas being adapted to compensate at least two different defects.

According to a further aspect, the at least two optically relevant areas of the plate comprise a polarizer which change the polarization of the partial beam by a predetermined amount.

In yet another aspect, ultra-short laser pulses are used to introduce the at least one arrangement of local persistent modifications.

In a further beneficial aspect, the plate is adapted to be moved and/or to be rotated essentially perpendicular to the beam directions of the at least two partial beams.

Similar to an optical element for a single channel, this feature enables an optimization of the defect compensation by adjusting the plate to a position within the channel matrix at which the IPS loss is minimized.

According to another aspect, the plate is adapted to be dynamically inserted in a beam path of the partial beams of the least two channels during the operation of the illumination system.

In still a further advantageous aspect, a method for compensating at least one defect in at least one channel of an illumination system of a microlithographic projection exposure system uses an illumination system of any of the above described aspects.

Finally, another aspect further comprises the step of inserting at least one optical element in at least one channel having a defect which is best compensated by the at least one optical element.

DESCRIPTION OF THE DRAWINGS

The patent or application file contains at least one drawing executed in color. Copies of this patent or patent application publication with color drawing(s) will be provided by the Office upon request and payment of the necessary fee.

In order to better understand the present invention and to appreciate its practical applications, the following figures are provided and referenced hereafter. It should be noted that the figures are given as examples only and in no way limit the scope of the invention.

FIG. 3B presents a centre portion, and FIG. 3C indicates a right portion of the field of view of the focus plane of the illumination system;

DETAILED DESCRIPTION OF PREFERRED EMBODIMENTS

In the following, the present invention will be described hereinafter in more detail with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

Figure 1:
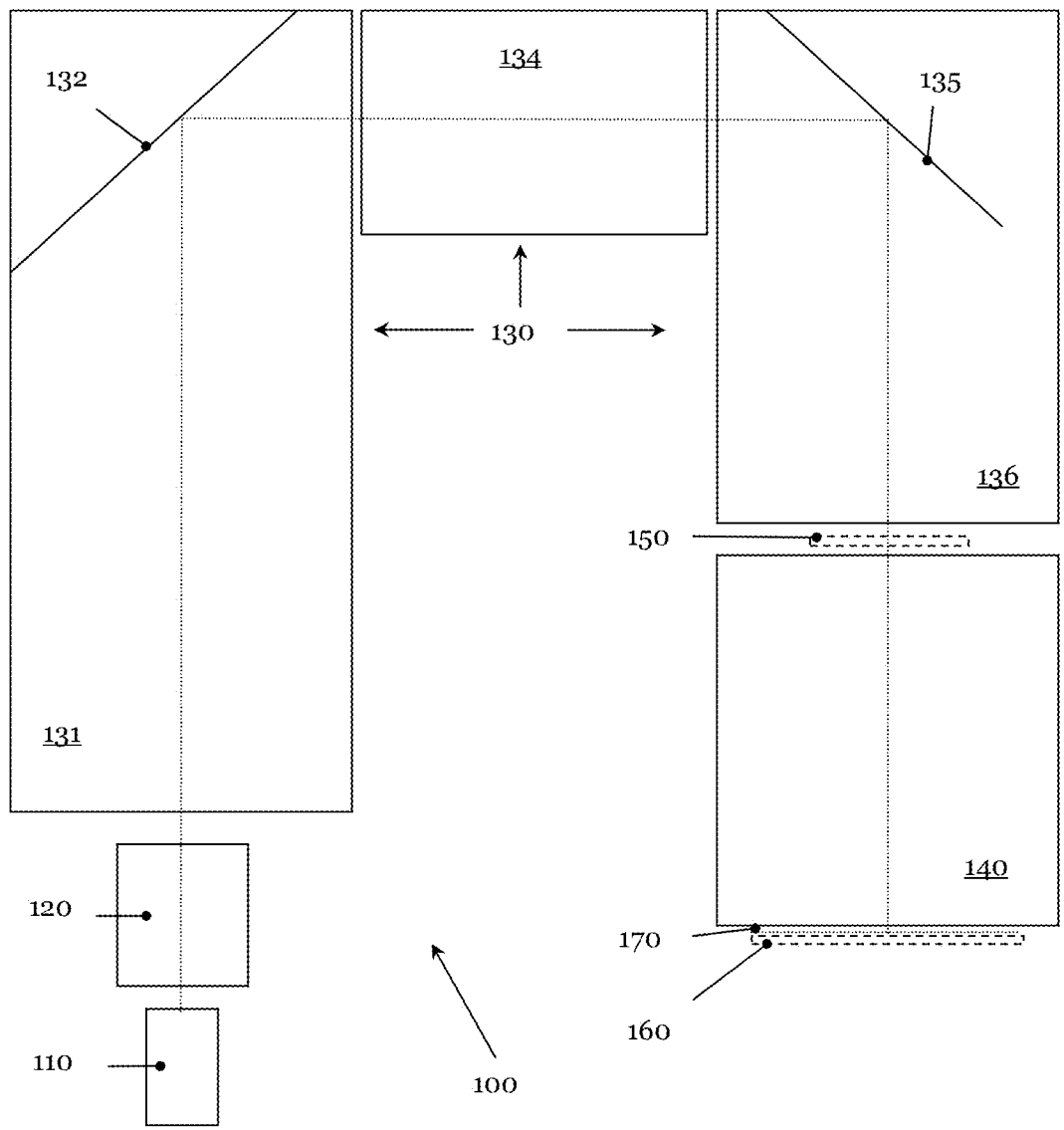
FIG. 1 schematically presents essential components of a microlithographic projection exposure system.

FIG. 1 schematically shows the essential components of a microlithographic projection exposure system 100. A light source 100 emits linearly polarized electromagnetic radiation into a beam expansion unit 120. For lithography systems in the ultraviolet (UV) or in the DUV wavelength range an excimer laser is typically applied as a light source 110. As already mentioned, KrF excimer laser systems are used for the 248 nm, ArF excimer laser systems are used for the 193 nm, and $F_2$ excimer laser systems are used for the 157 nm wavelength ranges. Excimer laser systems emit typically linearly polarized electromagnetic radiation. Furthermore, excimer laser systems normally emit light pulses or laser pulses having a pulse duration in the nanosecond range. It is also possible to apply the systems and methods discussed in the following to other wavelengths used in future photolithographic systems.

The beam expansion unit 120 increases the diameter of the laser beam 145 from the millimeter to the centimeter range. For example, the beam entering the expansion unit 120 can have a size of 15 nm×20 nm and the beam exiting the expansion unit 120 may have for example dimensions of 80 mm×80 mm.

In the exemplary embodiment of FIG. 1, the illumination system 130 comprises three different parts. The first part 131 (also called optical unit) comprises the optical components to split the light beam generated by the light source 100 and expanded by the beam expansion unit 120 in partial light beams or partial beams (not shown in FIG. 1). Details of the generation and forming of the partial beams will be discussed in the context of FIG. 2. The deflection mirror 132 directs the partial beams into the second part 134 (also called lens group). In the second part 134, the partial beams are shaped and the spatial distribution of the optical intensity is rearranged. At the exit of the second part 134, there is an intermediate field plane in which a reticle masking system (REMA) is arranged which can be used as an adjustable field stop (not indicated in FIG. 1). The third part 136 comprises the objective which images the reticle masking system onto the wafer 150, which is arranged in a further field plane of the illumination system 130.

Figure 2:
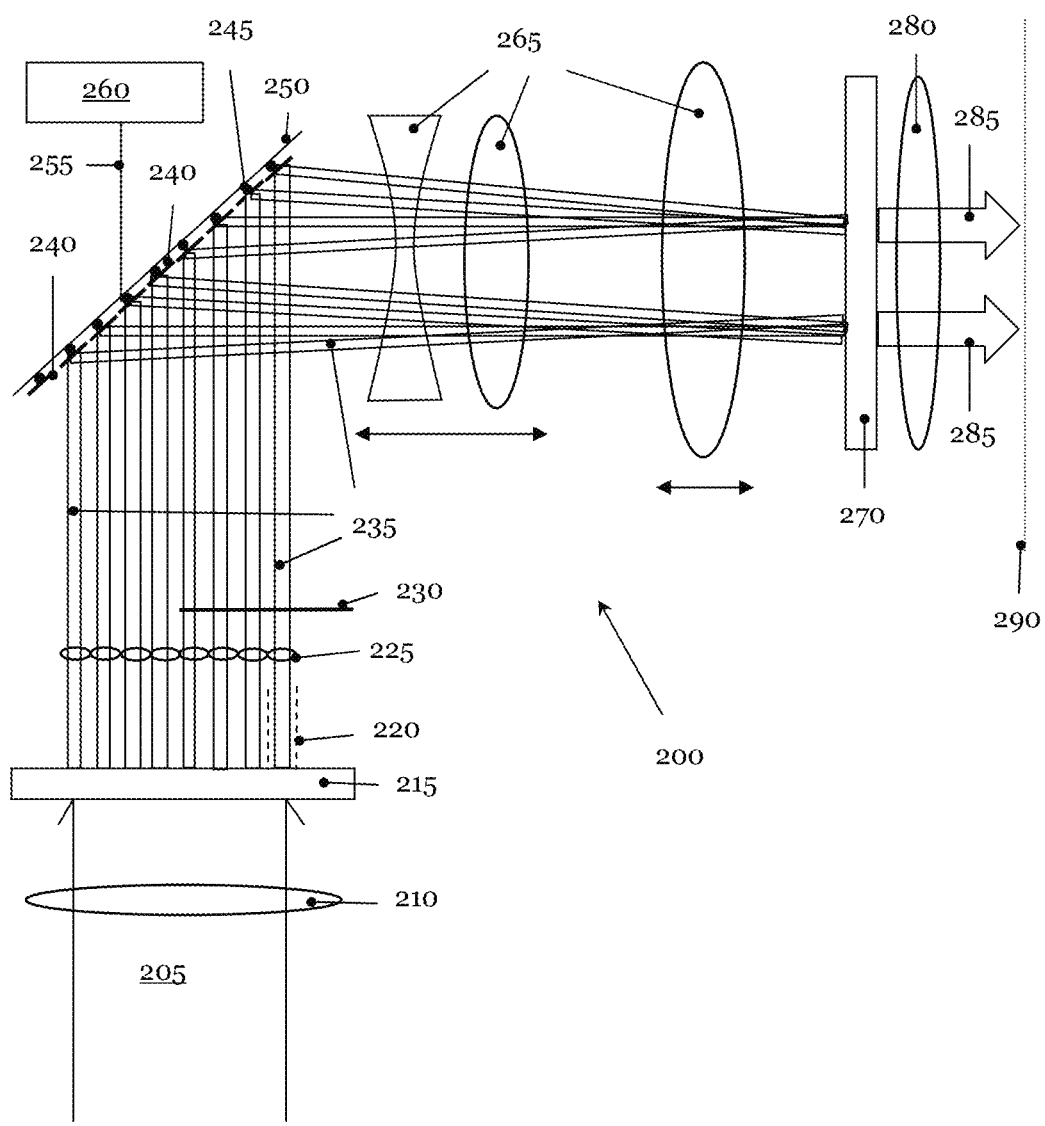
FIG. 2 schematically shows a cross-section of a channel arrangement of a microlithographic illumination system.

The projection objective 140 images the light which traversed the mask 150 onto a photosensitive layer 170 arranged on a substrate 160. The substrate 150 is often a silicon wafer. FIG. 2 illustrates in more detail a first portion of the illumination system 130 which is arranged in the first 131 and the second 134 parts of the illumination system 130. The expanded light beam 205 enters the first part 131 of the illumination system 130. A first lens 210 shapes the expanded light beam 205 for the further processing. Then, a two-dimensional raster array 215 of micro-lenses splits the expanded beam 205 in a multitude of partial beams 235. The multitude of partial beams 235 is regularly arranged and mutually parallel. A further array of micro-lenses 225 adjusts the beam angles of the partial beams 235.

Figure 10:
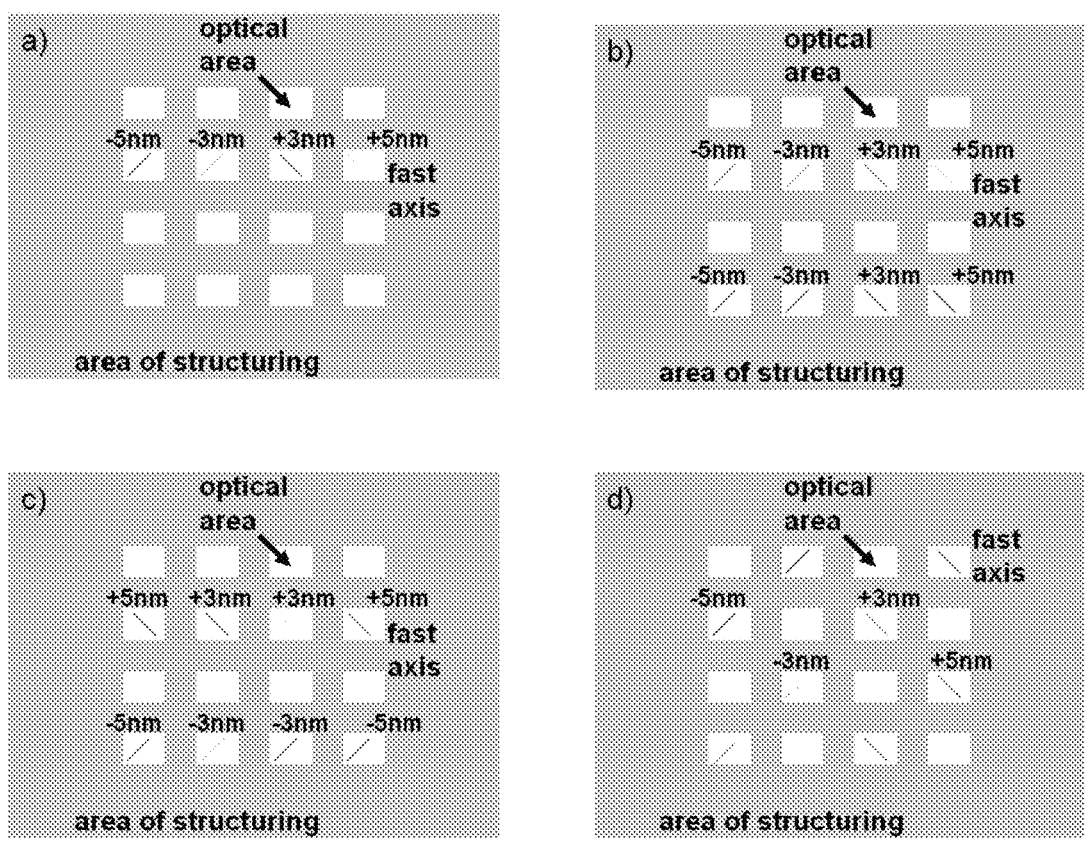
FIGS. 10A-10D schematically show the plate of FIG. 9 having four different configurations of strain induced birefringence of optically relevant areas wherein each configuration has different orientations of their fast axes and different amounts of retardation.

In an exemplary embodiment, the expanded beam has dimensions of 80 mm×80 mm. The two-dimensional raster array of micro-lenses 215 splits the beam for example in squares of 4 mm×4 mm which results in an array or in a matrix of 20×20 partial beams 205. This means that in the discussed example a channel 220 of a partial beam 235 has dimensions perpendicular to the beam direction of 4 mm×4 mm. In FIG. 2, a channel 220 is symbolized by dashed lines. The two two-dimensional micro-lens arrays 215 and 225 concentrate the partial beams 235 to an area of 2 mm×2 mm. The illumination system applied at the discussion of FIGS. 10-12, which are described below, uses a multimirror array (MMA) of 64×64 mirror elements.

Downstream the micro-lens array 225 a polarization plate 230 is inserted in some channels 220 of partial beams 235. The polarization plate 230 changes the linear polarization of the partial beams in a defined manner for example by rotating the polarization by a predefined angle and/or by forming circularly polarized partial beams 235. Thus, the polarization plate 230 allows to setting up a predetermined polarization state of the beam(s) 285 exiting the illumination system 130 to illuminate the mask 150.

Each of the partial beams 235 strikes a respective mirror 240 of the two dimensional mirror array 250. In the discussed example, the mirrors 240 of the mirror array 250 are flat and have a size of 3 mm×3 mm. Each of the mirrors 240 can be tilted about two tilt axes which are aligned perpendicular to each other. The tilting movement of each of the mirrors 240 can be individually controlled by a control unit 260 which is connected to the mirror array 250 via an electrical connection 255.

The individual mirrors 240 are located in a square region of 4 mm×4 mm and the square regions are located beside one another on the two-dimensional mirror array 250. The number of the individual mirrors 240 is adjusted to the number of the partial beams 235 and is in the discussed example ≥400. The mirror array 250 is arranged on the deflection mirror 132 of the first part 131 of the illumination system 130. Instead of the mirror array 250 an array of controllable reflective diffraction gratings can also be used to deflect the partial beams 235 in a predetermined direction.

The optical components 265 are used to form or shape the partial beams 235 reflected from the mirrors 240. For this purpose, at least some of the optical components 265 are movable along the optical axis of the illumination system 130 (not shown in FIG. 2). For example, the optical elements 265 can form a zoom-axicon objective. The exit pupil of the optical components 265 is the pupil-shaping surface of the illumination system 130.

In the discussed example, a raster element 270 is arranged in the pupil-shaping surface or close to it. The raster element 270 has a two-dimensional array of diffractive or refractive optical elements which can fulfil several functions. The raster element 270 shapes the incident partial beams 235. Further, it forms partial beams leaving the raster element 270 which superimpose in a subsequent field plane and thus mixing the partial beams to homogeneously illuminate the exit pupil of the illumination system 130 in which the mask or reticle 150 is arranged (not indicated in FIG. 2). The raster element 270 can be realized as a two-dimensional prism array in which the individual prisms are arranged in an order to illuminate the homogenizing field plane as desired. Instead of the raster element 270, a conventional mixing element in form of an integrator rod or a fly's eye condenser can also be used (not shown in FIG. 2).

The lens 280 symbolizes the objective arranged in the third part 136 of the illumination system 130 which projects the homogenizing field plane having the mask system onto the reticle plane 290 in which the mask 150 is arranged.

The mirror array 250 changes the angular distribution of the partial beams 235 incident on the mirrors 240 of the mirror array 250, and thus rearranges the optical intensity distribution of the expanded beam 205. In the example schematically illustrated in FIG. 2, the beam 205 is concentrated into two output beams 285 which can be used to form a dipole setting. In the example of FIG. 2 the upper part of the optical beams 235 is used to form a first portion of the dipole setting, and the lower part of the optical beams 235 is used to form a second portion of the dipole setting. However, it is also possible to apply a different separation of the optical beams 235 in order to form the dipole setting of FIG. 2, or generally a predetermined setting.

Furthermore, the mirror array 250 can switch individual partial beams 235 by a respective tilting of an individual mirror in a respective portion of the pupil plane. This provides the possibility to set a desired or predetermined retardation distribution within the pupil plane of the illumination system 130 to compensate a respective retardation distribution within the pupil plane. The described retardation compensation process has additionally to fulfil the requirement that the optical intensity is homogeneously distributed within the predetermined setting, which is a dipole setting in the example of FIG. 2.

On their path from the two-dimensional raster array 215 to the two-dimensional raster array 270, the partial beams 235 traverse several optical elements as for example the micro-lens array 225, the polarization plate 230, and the optical components 265. Moreover, the partial beams 235 are reflected from the mirrors 240. At each of these interactions of the partial beams 235 with the optical components 215, 225, 240, 230, 265, 270, a partial beam 235 may be distorted. For example, photons of the partial beam 235 may be absorbed or scattered from the beam which results in a decrease of the intensity of the partial beam 235. Further, the phase relationship within the partial beam 235 may be distorted by the interaction with the optical components 215, 225, 230, 240, 265, 270. Moreover, the polarization of the partial beam 235 may be distorted by the reflection and/or transmission of the partial beam 235 at the interfaces and/or coatings of the components 215, 225, 230, 240, 265, 270. Additionally, intrinsic or material birefringence of the optical elements 215, 225, 230, 265, 270 can change the polarization state of a partial beam 235.

The following description concentrates on the compensation of polarization variations which the partial beam 235 acquires during its path in the respective channel 220. It is however appreciated that the discussed measures can also be used to compensate other defects of a partial beam 235.

In the next step, the fabrication of an optical element is explained which is able to compensate a polarization variation of a partial beam 235. Then, examples of the insertion of the optical element in the channel 220 of a partial beam 235 are discussed.

Figure 3A:
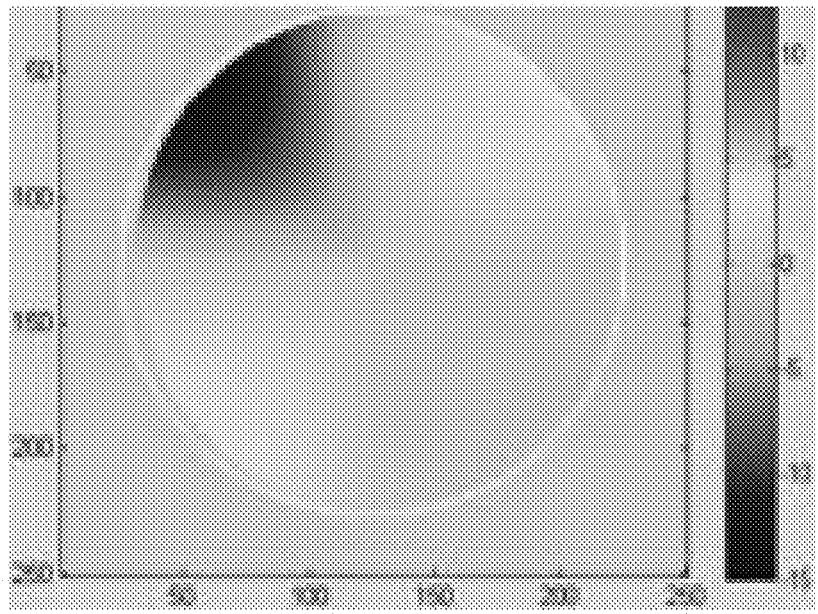
FIGS. 3A-3C illustrate a distribution of a retardation of an illumination system of a DUV projection exposure system of a linearly polarized optical beam analysed in the plane of the photolithographic mask, FIG. 3A reproduces a left portion.
Figure 3B:
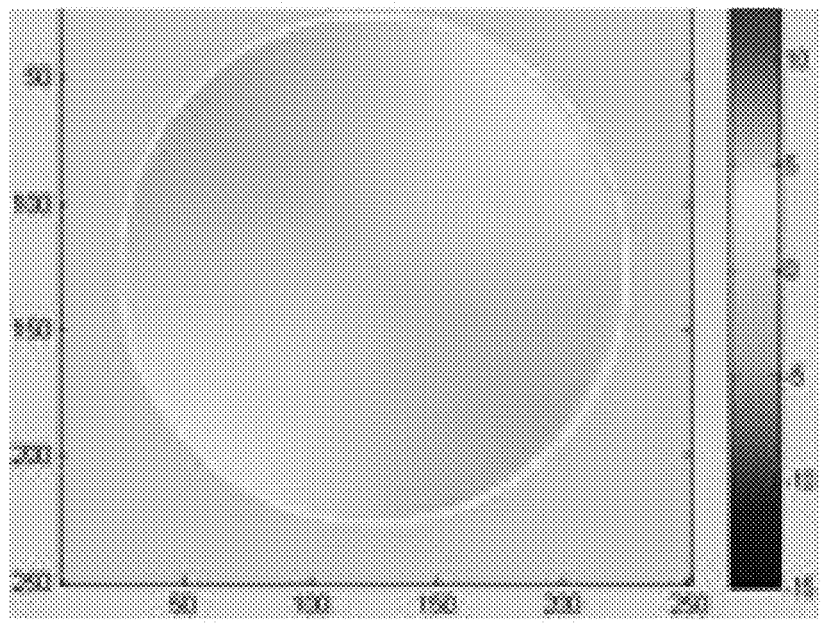
Figure 3C:
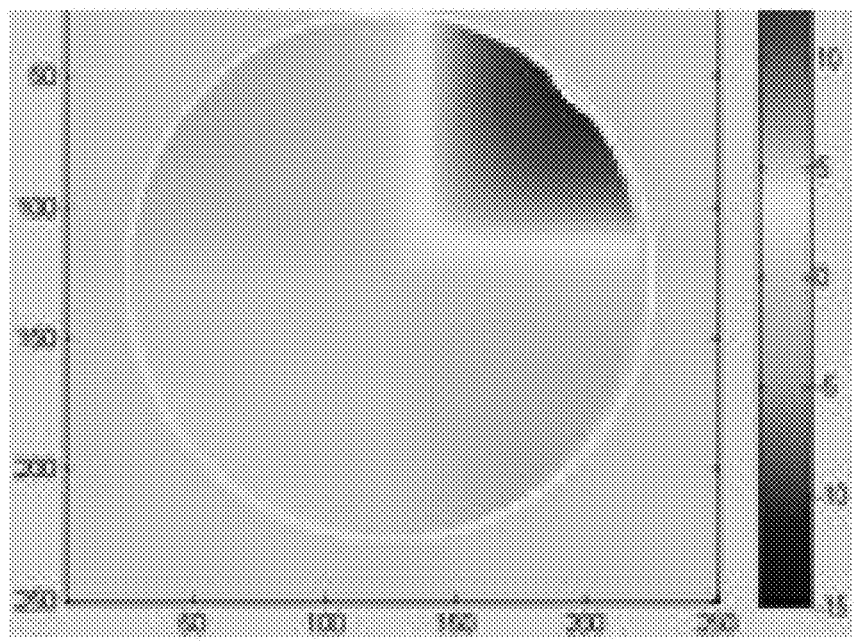

FIGS. 3A-3C schematically depicts the effect of an intrinsic or of a material birefringence of the optical components 215, 225, 230, 265, 270 of the illumination system 130 of the projection exposure system 100 in the plane 290 of the mask 150. As already mentioned at the discussion of FIG. 1, the output beam 205 of the laser source 110 is essentially linearly polarized. Typically the beam 205 is horizontally polarized (in the paper plane of FIG. 2) or vertically polarized polarized (perpendicular to the paper plane of FIG. 2).

FIGS. 3A-3C presents an exemplary illustration of the scalar birefringence component Ret45 which illustrates the projection of the vector retardation onto the 45° axis, wherein the angle is measured with respect to the x-axis. FIGS. 3A-3C clearly indicate that the retardation increases strongly toward the lens edge of the illumination system 130. Further, FIGS. 3A-3C also indicate that the retardation also strongly increases toward the pupil edge. This means that the material birefringence of the optical elements 215, 225, 230, 265, 270 of the illumination system 130 has both a strong field and pupil dependence.

The retardation $\Delta$ of an optical element 215, 225, 230, 265, 270, 500 having a material birefringence is determined by the thickness d of the optical element 215, 225, 230, 265, 270, 500 and the refractive indices of its fast $n_F$ and slow axis $n_S$ according to the equation:

$$\Delta = d \cdot (n_S - n_F) = d \cdot \Delta n = d \cdot \delta \tag{1}$$

where $\delta$ is called birefringence.

The retardation $\Delta$ caused by the material birefringence of the optical elements 215, 225, 230, 265, 270 varies the polarization state of the partial beams 235, and thus results in a variation of the polarization of the illumination beams 285 across the illumination field 290 of the mask 150. As a result, a polarization variation exemplarily dispersed in FIGS. 3A-3C by the material birefringence of the optical components 215, 225, 230, 265, 270 leads to a reduction of the intensity in preferred state (IPS). The IPS specification is an important characteristic for the customer of microlithographic projection exposure systems 100. Therefore, an IPS loss has to be compensated so that the projection exposure system 100 fulfils a predetermined IPS threshold. Presently, a typical IPS specification is for example in the range of 94% to 98% depending of the illumination setting.

This high IPS specification threshold results in a retardation budget of the overall projection exposure system 100 including also all external contributions in the range of approximately 10 nm. Thus, the IPS specification sets new birefringence requirements to every optical element 215, 225, 230, 265, 270 of the illumination system 130 as well as for the projection system 140 of the microlithographic projection exposure system 100. Furthermore, it also makes high demands on the polarization variations induced by the mask 150, the photoresist 170 and the pellicle of the mask 150 (not shown in FIG. 1). The influence of the last components which are not part of the projection exposure system 100 is not addressed in the present invention.

Figure 4:
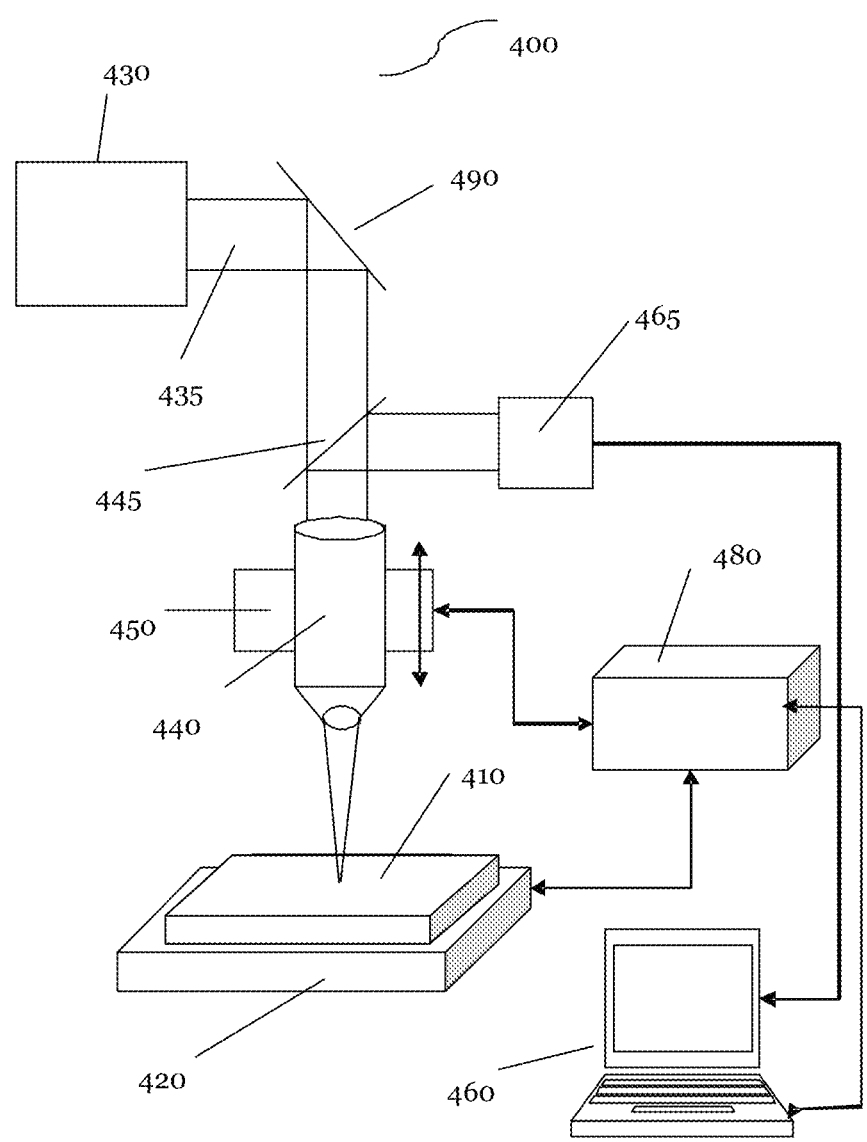
FIG. 4 schematically represents a block diagram of an apparatus for introducing an arrangement of local persistent modifications in an optical element.
Figure 5:
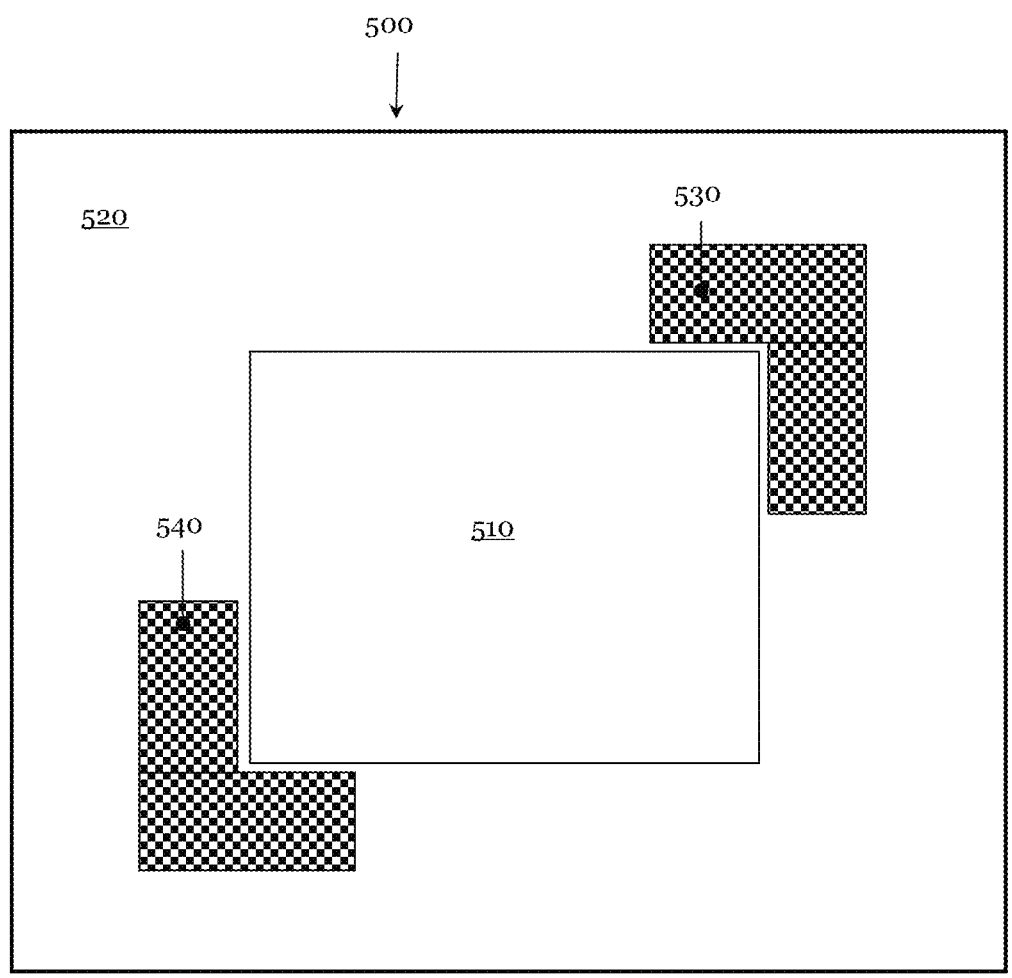
FIG. 5 schematically illustrates an optical element having an optically relevant area and an optically not relevant area into which arrangements of local persistent modifications are introduced.

FIG. 4 depicts a schematic block diagram of an apparatus 400 which can be used to introduce an arrangement of local persistent modifications in an optical element 215, 225, 230, 265, 270 and in particular to a specific optical element 500 discussed in the context of FIG. 5 to compensate the effect of the material birefringence of the optical elements 215, 225, 230, 265, 270 of the projection exposure system 100. The apparatus 400 comprises a chuck 420 which may be movable in three dimensions. An optical element 410 may be fixed to the chuck 420 by using various techniques as for example clamping. The optical element 410 may be one of the optical elements 215, 225, 265, 270 of FIG. 2 as well as the specific optical element 500 discussed in FIG. 5.

The apparatus 400 includes a pulse laser source 430 which produces a beam or a light beam 435 of pulses or laser pulses. The laser source 430 generates light pulses or laser pulses of a variable duration. The pulse duration may be as low as 10 fs but may also be continuously increased up to 100 ps. The pulse energy of the light pulses generated by the pulsed laser source 430 can also be adjusted across a huge range reaching from 0.01 μJ per pulse up to 10 mJ per pulse. Further, the repetition rate of the laser pulses comprises the range from 1 Hz to 100 MHz. In a preferred embodiment the light pulses may be generated by a Ti:Sapphire laser operating at a wavelength of 800 nm. However, the methods described in the following are not limited to this laser type, principally all laser types may be used having a photon energy which is smaller than the band gap to the material of the optical element 410 and which are able to generate pulses with durations in the femtosecond range. Therefore, for example Nd-YAG laser or dye laser systems may also be applied.

The apparatus 400 may also comprise more than one pulse laser sources 430 (not shown in FIG. 4).

The following table represents an overview of laser beam parameters of a frequency-doubled Nd-YAG laser system which is used in one aspect for introducing an arrangement of local persistent modifications in an optical element 410. A single local persistent modification locally modifies a density of the optical element 410. The locally modified density of the optical element 410 is discontinuously modified within at least one small volume of the optical element 410, wherein the at least one small volume is called a pixel. Furthermore, the locally modified density of a single local persistent modification induces a strain distribution around the local persistent modification of the induced pixel. By introducing or writing many pixels in a dedicated arrangement in the material of the optical element 410 a desired strain distribution can be generated.

It is known that the induced change in the impermeability $\Delta\beta_{ij}$ linearly depends on the strain induced in the material, wherein the impermeability $\beta$ and the permittivity $\epsilon$ are linked by:

$$\varepsilon = \frac{1}{\beta}. \tag{2}$$

This dependence can be expressed with the aid of the components of the stress optic matrix:

$$\Delta\beta_{ij} = \sum_{k=1, l=1}^{3,3} q_{ijkl} \sigma_{kl} \tag{3}$$

Therefore, the strain induced in the material of the optical element 215, 225, 230, 265, 270, 500 by introducing or writing pixels in the optical element 215, 225, 230, 265, 270, 500 is directly linked to the retardation $\Delta$ of an optical beam or the partial beam 235 in the material and is given by the equation:

$$\Delta = d \cdot n_0^3 \cdot \sqrt{\left(\frac{\beta_{11} - \beta_{22}}{2}\right)^2 + \beta_{12}^2} \tag{4}$$

where d is again the thickness of the optical element 215, 225, 230, 265, 270, $n_0$ is the refractive index of the isotropic material of the optical element 215, 225, 230, 265, 270, 500 and $\beta_{ij}$ are the components of the impermeability matrix of the material of the optical element 215, 225, 230, 265, 270, 500.

In the following, one set of laser beam parameters characterizing a specific laser pulse is also called a writing mode, as the laser beam is focussed into the optical element 215, 225, 230, 265, 270, 500 and laser pulses are "written" into the material of the optical element 410. Each set of laser beam or laser pulse parameters or each writing mode induces a local deformation in the optical element 215, 225, 230, 265, 270, 500 which is characteristic or specific for this parameter set. In other words, each parameter set for a laser pulse or each writing mode generates its specific deformation in the material of the optical element 410.

The effect of a laser pulse on the optical element 215, 225, 230, 265, 270, 500 is in the following described in form of a parameter called mode signature (MS). In this concept, the area of the optical element 215, 225, 230, 265, 270, 500 is divided into small elementary areas, preferably small rectangles or squares. The mode signature describes the distortion or deformation of an elementary area due to the action of a laser pulse or a sum of laser pulses.

TABLE 1

Numerical values of selected laser beam parameters for a frequency-doubled Nd-YAG laser system
Overview

| Parameter | Numerical value | Unit |
|---|---|---|
| Pulse energy | 0.05-5 | µJ |
| Pulse length | 0.05-100 | ps |
| Repetition rate | 1-10 000 | kHz |
| Pulse density | 1 000-10 000 000 | mm$^{-2}$ |
| NA | 0.1-0.9 | |
| Wavelength | 532 | nm |

The following tables indicate parameters for differently influencing the arrangement of local persistent modifications and thus the induced strain distribution in the material of the optical element 410. Table 2 presents parameters of a frequency-doubled Nd-YAG laser system for a mode of introducing or writing pixels called standard process window (Std PW).

TABLE 2

Numerical values of selected laser beam parameters for a Nd-YAG laser system for a standard process window
Std PW (standard process window)

| Parameter | Numerical value | Unit |
|---|---|---|
| Pulse energy | 0.45 | µJ |
| Pulse length | 8 | ps |
| Repetition rate | 50 | kHz |
| Pulse density | 1 000-100 000 | mm$^{-2}$ |
| NA | 0.3 | |
| Wavelength | 532 | nm |

Table 3 summarizes parameters of a mode called low registration process window (Low-Reg PW) again of an embodiment using a frequency-doubled Nd-YAG laser system. This operation mode of the laser system 430 uses light pulses having a lower energy than the Std PW, but introduces a higher pixel density.

TABLE 3

Numerical values of selected laser beam parameters for a Nd-YAG laser system for a low registration process window (LowReg PW)
LowReg PW (low registration process window)

| Parameter | Numerical value | Unit |
|---|---|---|
| Pulse energy | 0.32 | µJ |
| Pulse length | 8 | ps |
| Repetition rate | 50 | kHz |
| Pulse density | 5 000-500 000 | mm$^{-2}$ |
| NA | 0.3 | |
| Wavelength | 532 | nm |

The steering mirror or steering system 490 directs the pulsed laser beam 435 into the focusing objective 440. The objective 440 focuses the pulsed laser beam 435 into the optical element 410. The NA (numerical aperture) of the applied objective 440 depends on the predetermined spot size of the focal point and the position of the focal point within the material of the optical element 410. As indicated in table 1, the NA of the objective 440 may be up to 0.9 which results in a focal point spot diameter of essentially 1 µm and a maximum intensity of essentially $10^{20}$ W/cm$^2$.

The apparatus 400 also includes a controller 480 and a computer system 460 which manage the translations of the two-axis positioning stage of the sample holder 420 in the plane of the x and the y direction. The controller 480 and the computer system 460 also control the translation of the objective 440 perpendicular to the plane of the chuck 420 (z direction) via the one-axis positioning stage 450 to which the objective 440 is fixed. It should be noted that in other embodiments of the apparatus 400 the chuck 420 may be equipped with a three-axis positioning system in order to move the optical element 410 to the target location and the objective 440 may be fixed, or the chuck 420 may be fixed and the objective 440 may be moveable in three dimensions. It should be further noted that manual positioning stages can also be used for the movement of the optical element 410 to the target location of the pulsed laser beam 435 in the x, the y and the z direction and/or the objective 440 may have manual positioning stages for a movement in three dimensions.

The computer system 460 may be a microprocessor, a general purpose processor, a special purpose processor, a CPU (central processing unit), a GPU (graphic processing unit), or the like. It may be arranged in the controller 480, or may be a separate unit such as a PC (personal computer), a workstation, a mainframe, etc. The computer system 460 may further comprise I/O (input/output) units like a keyboard, a touchpad, a mouse, a video/graphic display, a printer, etc. In addition, the computer 460 may also comprise a volatile and/or a non-volatile memory. The computer system 460 may be realized in hardware, software, firmware, or any combination thereof. Moreover, the computer system 460 may control the laser source 430 (not indicated in FIG. 4).

Further, the apparatus 400 may also provide a viewing system including a CCD (charge-coupled device) camera 465 which receives light from an illumination source arranged to the chuck 420 via the dichroic mirror 445. The viewing system facilitates navigation of the optical element 410 with respect to the target position. Further, the viewing system may also be used to observe the formation of the pixel arrangement in the optical element 410 by the pulse laser beam 435 of the light source 430.

FIG. 5 schematically represents an optical element 500 which is prepared to compensate a polarization variation of a partial beam 235 in a channel 220. The optical element 500 comprises an optically relevant area 510 which the partial beam 235 traverses. The optical element 500 can be of any material which is transparent for the respective wavelength of the partial beam 235. In the DUV range quartz or calcium difluoride (CaF$_2$) can for example be applied to fabricate the optical element 500. In order to introduce a significant amount of retardation, the material of the optical element 500 should be amorphous; especially amorphous quartz is applicable.

In the example discussed in the context of FIG. 2, the optically relevant area 510 of the optical element 500 has a size >2 mm×2 mm. The optically relevant area 510 is surrounded by an optically not relevant area 520. In the discussed example, the outer dimensions of the optically not relevant area 520 are ≤4 mm×4 mm. A mounting is attached to the optically not relevant area 520 in order to insert and to fix the optical element 500 in the channel 220 (not shown in FIG. 5).

The optically not relevant area 520 is used to introduce one or several arrangements 530, 540 of local persistent modifications. The arrangements 530, 540 are indicated in FIG. 5 to just illustrate the principle. At the explanation of the apparatus 400, i.e. during the discussion of FIG. 4, it is described in detail how the introduction of an arrangement of local persistent modifications or pixels introduces a defined local strain distribution which causes a defined strain induced birefringence. In the example of FIG. 5, the pixel arrangements 530, 540 result in a birefringence where the fast axis is oriented along the corners having the pixel arrangements 530, 540 and the amount of retardations is essentially zero at the centre and increases toward the corners having the pixel arrangements 530, 540.

FIG. 2 reveals that the material birefringence of the optical components 215, 225, 230, 265, 270 results in a systematic dependence of the retardation in the pupil plane. It is therefore a first approach to compensate the material birefringence of the optical components 215, 225, 230, 265, 270 by fabricating optical elements 500 which have a fixed fast axis and various maximum amounts of retardations. As indicated by equation (1) this can be performed by either varying the thickness of the optical element 500 or by varying the strain induced birefringence by changing the pixel arrangements 530, 540. It is also possible to use a combination of a variation of both parameters in order to fabricate an optical element 500 having a predetermined amount of retardation. The various optical elements 500 can then be inserted in the channels 220 of the respective partial beams 235 to compensate the respective polarization variation in the pupil plane.

This approach has the advantage that the polarization variation of the optical elements 215, 225, 230, 265, 270 of individual channels 220 has not to be analysed. Further, it is not necessary to determine individual pixel arrangements 50, 540 for each of the optical elements 500. Therefore, this approach is discussed in the following examples.

However, it has to be stressed that it is in a second approach also possible to measure the polarization variation of the optical components 215, 225, 230, 265, 270 of an individual channel 220 and calculate from this data a respective pixel arrangement 530, 540 for an individualized defect compensation of the optical element 500.

Furthermore, the optical element 500 can also be equipped with one or more actuators to temporarily induce a strain induced birefringence (not shown in FIG. 5). This allows a dynamic setting of the retardation during the operation of the illumination system 130. The actuator can be arranged to modify the fast axis of the birefringence of the optical element 500, and thus modify both the orientation of the fast axis and the retardation. On the other hand, it can be arranged to just vary the retardation but leaving the orientation of the fast axis unchanged. For example a piezo-element can be applied as an actuator.

Furthermore, the optical element 500 may be dynamically inserted in the channel 220 depending on the adjustments of the optical components in the channel 220, in particular as a consequence of a movement of the optical elements 265. This enables a flexible response to various settings of the illumination system 130.

Figure 6:
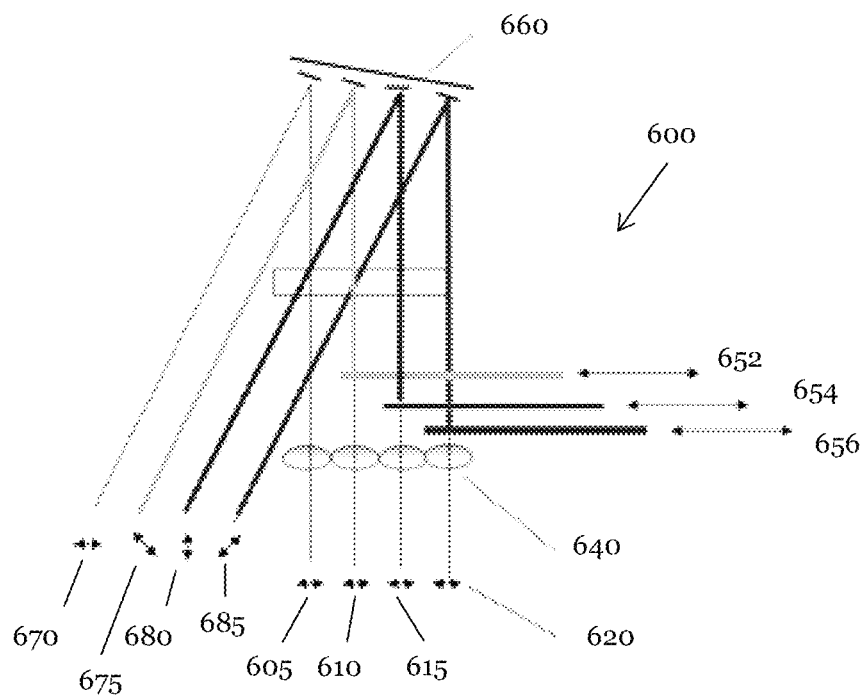
FIG. 6 schematically represents a cut-out of FIG. 2, wherein polarization plates are inserted in the partial beams of various channels.

FIG. 6 shows a cut-out of FIG. 2. The raster element 215 of FIG. 2 generates four incident partial beams 605, 610, 615, 620 which are linearly polarized having their polarization horizontally oriented in the sheet plane. After traversing the focussing micro-lens array 640, polarization plates 652, 654, 656 are inserted in the partial beams 610, 615, 620 in order to change the polarization of the incident partial beams 610-620 by a predetermined amount. As can be seen from FIG. 6, each polarization plate 650 rotates in this example the polarization of the beams 610, 615, 620 by 45° (π/4). As the action of the polarization plates 652, 654, 656 are additive, the partial beam 615 is rotated by 90° and the partial beam 620 is rotated by 135° with respect to the polarization of the partial beam 670. The mirrors 660 reflect the partial beams 605-620 in a predetermined direction as is indicated in FIG. 2.

In order to generate a predetermined polarization when superimposing the partial beams 605-620, it may however be required that the partial beam 620 has an elliptically polarization instead of a linear polarization. For this purpose, an optical element 500 is inserted in the channel of the partial beam 620 having one or several arrangements 530, 540 of local persistent modifications which generate a strain induced birefringence with a fixed fast axis and a defined retardation in order to generate in combination with the polarization plate 656 the required polarization of the partial beam 785.

Figure 7:
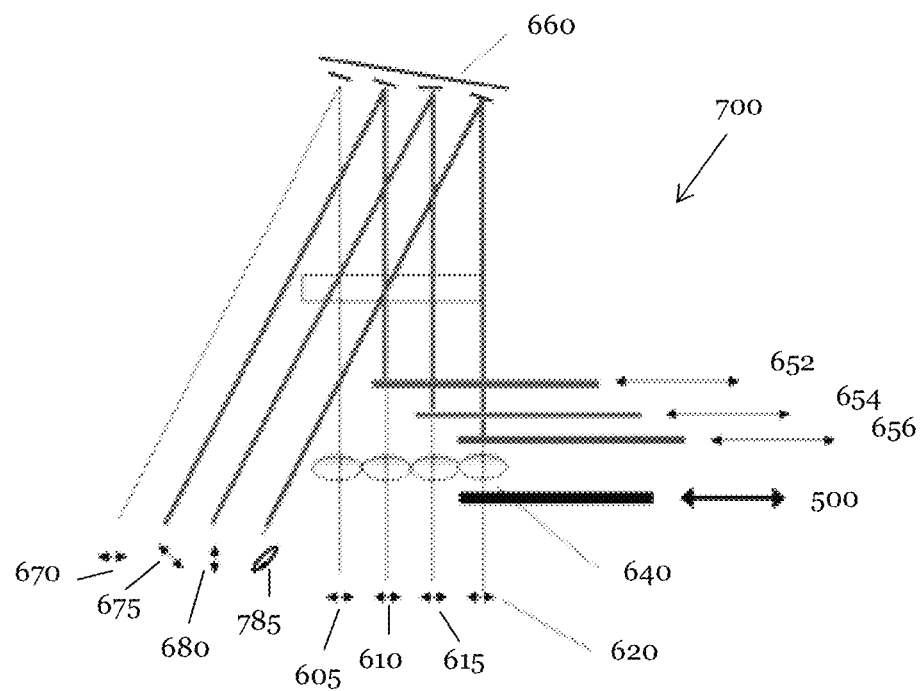
FIG. 7 shows FIG. 6 where an optical element is arranged in one of the channels in order to vary the polarization of the respective partial beam.

FIG. 7 illustrates this situation. An optical element 500 having a predetermined retardation is inserted in the partial beam 620 and changes the polarization of the reflected beam 785 according to the retardation of the optical element. As the incident beam 620 is linearly polarized the effect of the optical element 500 depends on the orientation of its fast axis relative to the polarization of the partial beam 620. An angle of ±45° between the fast axis of the optical element 500 and the polarization of the partial beam 620 has a maximum effect on the polarization. The sign of the fast axis of the optical element 500 has to be different to the sign of the effective retardation axis of the illumination system in order to result in a compensation of the polarization variation.

The insertion of the optical element 500 upstream of the polarization plates 650 is beneficial as this arrangement facilitates the orientation of the fast axis of the optical element 500 with respect to the polarization of the partial beam 620. On the other hand, it is also possible to arrange the optical element 500 downstream of the polarization plates 652, 654, 656 when the orientation of its fast axis of the optical element 500 is controlled with respect to the polarization of the partial beam 620.

The impact of the optical element 500 is controlled by the IPS variation of the respective illumination beam 285.

Figure 8:
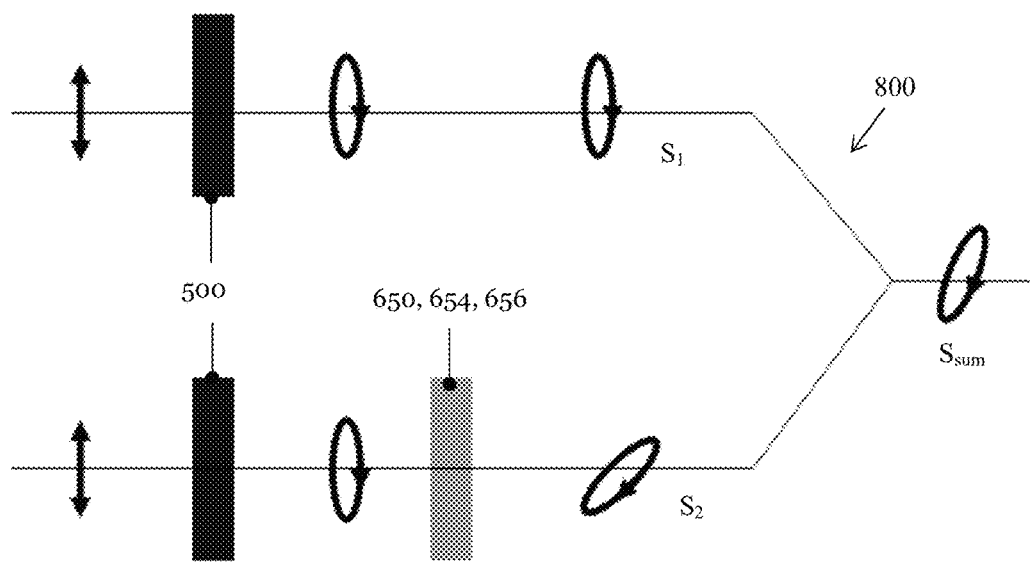
FIG. 8 schematically illustrates that the retardations of two superimposed partial beams are additive.

FIG. 8 shows that an optical element 500 inserted in a channel 220 having a defect in particular a polarization defect can also be used to compensate a polarization defect in a second channel when the partial beams 235 are superimposed in a single spot. FIG. 8 depicts two partial beams 235 whose polarizations are described by Stokes vectors $S_1$ and $S_2$. Both partial beams 235 pass through an optical element 500 introducing various amounts of retardations indicated as $Ret_1$ and $Ret_2$. Furthermore, the second partial beam 235 traverses one of the polarization plates 652, 654 or 656, so that that the partial beams 235 have different polarization rotations $\phi_1$ and $\phi_2$. Therefore, the Stokes vectors of the two partial beams are:

$$S_1 = \begin{pmatrix} 1 \\ \cos(2\varphi_1) \\ -\sin(2\varphi_1) \\ Ret_1 \end{pmatrix}, S_2 = \begin{pmatrix} 1 \\ \cos(2\varphi_2) \\ -\sin(2\varphi_2) \\ Ret_2 \end{pmatrix} \quad (5)$$

If the two partial beams 235 are superimposed by a respective tilting of the mirrors 240 or 660, the polarization of the superimposed beam is described by the Stokes vector $S_{sum}$:

$$S_{sum} = S_1 + S_2 = \begin{pmatrix} 2 \\ \cos(2\varphi_1) + \cos(2\varphi_2) \\ -\sin(2\varphi_1) - \sin(2\varphi_2) \\ Ret_1 + Ret_2 \end{pmatrix} \quad (6)$$

This demonstrates that the retardation introduced by the optical element 500 is also effective when an additional polarization rotation is generated by the polarization plates 650. This means that an optical element 500 inserted in a channel 220 of a partial beam 235 can also compensate polarization defects in various other channels at the superposition of the partial beams 235 even if the other channels have different polarization states due to the action of the polarization plates 652, 654, 656.

It can be useful to prepare a set or polarization plates 652, 654, 656 having a different amount of strain induced birefringence. Furthermore, it is also conceivable to introduce a pixel arrangement 530, 540 in one or more of the optical components 215, 225, 265, 270. In specific situations, a combination of an optical element 500 and a further compensation measure by the introduction of one or more pixel arrangements 530, 540 in one of the optical components 215, 225, 230, 265, 270 can also be used.

Moreover, there may be configurations of the illumination system 130 in which it is more effective to use a plate or a compensation plate acting on more than just one channel 220 instead of the optical element 500. It may be useful to apply a compensation plate for a portion of the channel matrix. For example, a compensation plate may be fabricated for a quarter of the two-dimensional channel matrix for the partial beams 235. Such a compensation plate may for example beneficially be used for a quadrupole setting of the illumination system 130.

Figure 9:
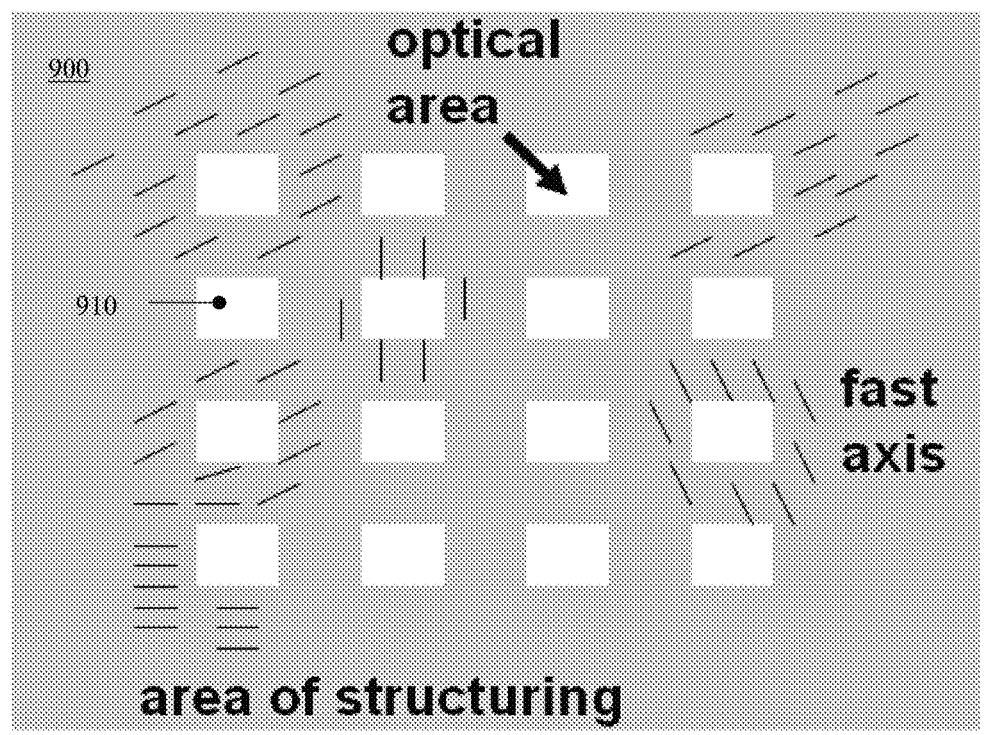
FIG. 9 schematically depicts a plate having an arrangement of 4×4 optically relevant areas for a matrix of 4×4 partial beams, wherein some of the optically relevant areas have different arrangements of local persistent modifications to cause a strain induced birefringence having different orientations of the fast axis and different amounts of retardation.

FIG. 9 presents a 4×4 compensation plate 900 for a channel-wise compensation of a birefringence, in particular a material birefringence of the optical components 215, 225, 230, 265, 270 in the channel 220 of the partial beams 235. As already mentioned above, the multi-mirror array (MMA) 130, 660 of the illumination system 130 considered in FIGS. 9 to 12 comprises an arrangement of 64×64 mirrors. The compensation plate 900 comprises channels 220, as for example the channels 220 of the third column, which do not act on the polarization of the respective partial beams 235. Furthermore, it has optically relevant areas 910 which provide a strain induced birefringence of different orientations of the fast axis and various amounts of retardations.

In the example of FIG. 9, the arrangements of local persistent modifications are introduced or written outside of the optically relevant area. This area is named in FIG. 9 as area of structuring. FIG. 9 just indicates that it is possible to fabricate a compensation plate 900 having various orientations of the fast axis and also having different amounts of retardations on a single compensation plate 900.

Figure 10A:
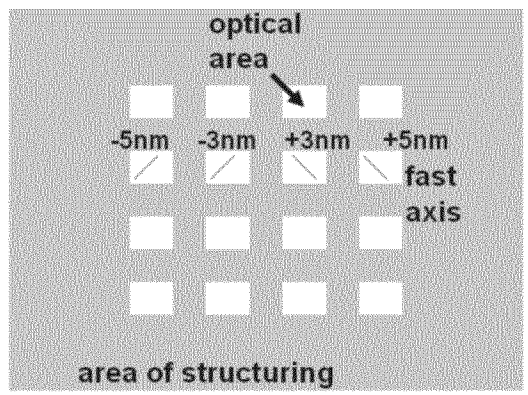
Figure 10B:
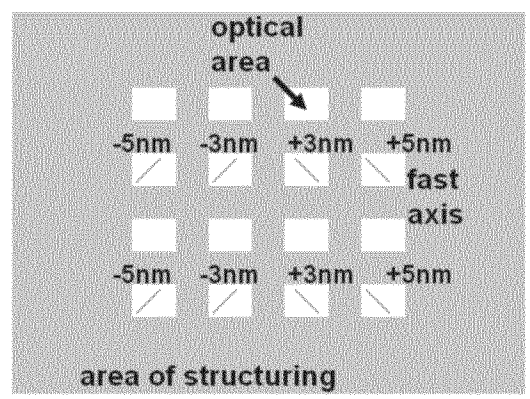
Figure 10C:
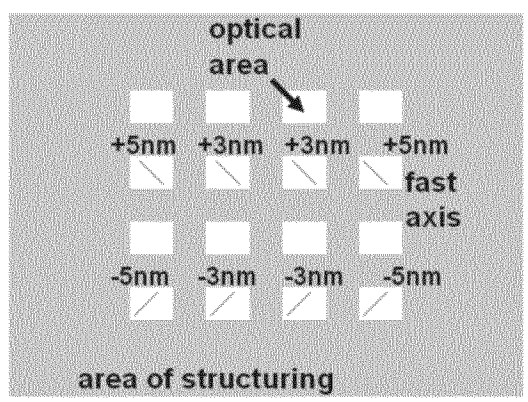
Figure 10D:
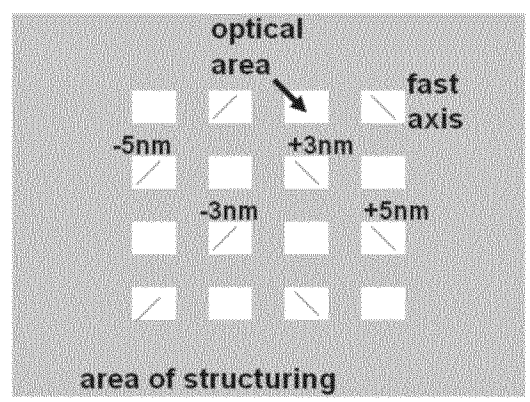
Figure 11:
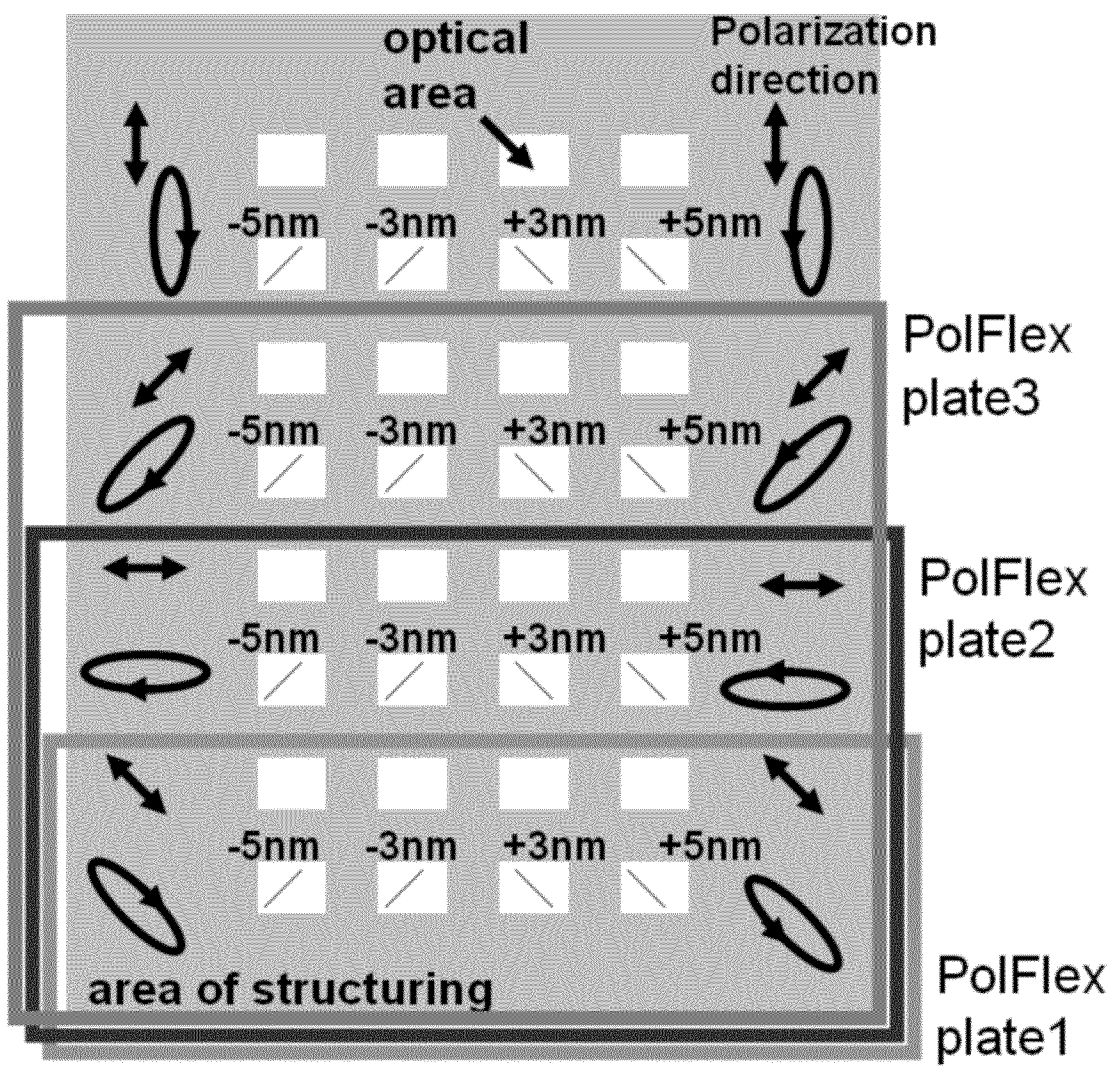
Figure 12:
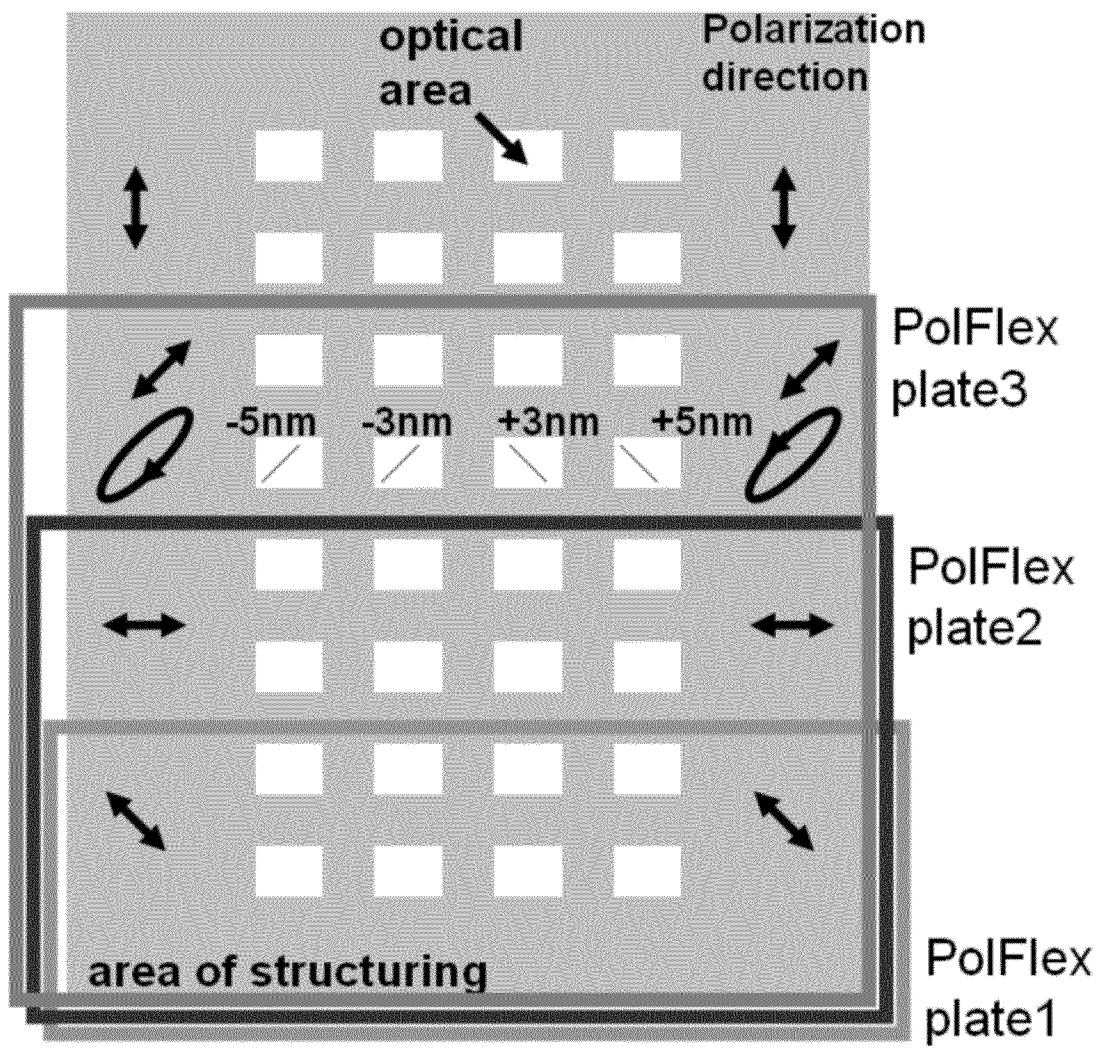

FIGS. 10A-10D illustrates various configurations for a 4×4 compensation plate. FIG. 10A shows a plate in which the optical areas of the second row have birefringence distributions with a different orientation of the fast axis and various amounts of retardations. FIG. 10B indicates the configuration of FIG. 10A, wherein the strain induced birefringence of the second row of FIG. 10A is repeated in the fourth row of FIG. 10B. FIG. 10C presents a configuration in which the orientation of the fast axis is fixed in one row but having different amounts of retardations. Finally, FIG. 10D distributes the strain induced birefringence to all rows of the compensation plate. For each of the polarization plates 652, 654, 656 there are channels which have a retardation effect and other ones which do not have it. In the case of a static approach, it is therefore possible to optimally set the compensation effect via a Pol-CompPup algorithm which calculates the mirror tilting angles of the mirrors 240 in order to optimize the illumination pupil. It simultaneously optimizes the desired intensity distribution, the desired (linear) polarization distributions and the required retardation distribution by setting each of the mirrors 240, the three polarization plates 652, 654, 656 and of the compensation plate 500.

As already mentioned at the discussion of the optical element 500, if the compensation plate 900 is inserted upstream of the polarization plates 652, 654, 656, the compensation plate 900 needs only to have two orientations of the fast axis which are ±45° relative to the polarization of the partial beams 235, 605-620. The following figures indicate a few conceivable implementation possibilities of a compensation plate 900 in combination with the polarization plates 652, 654, 656.

Figure 11:
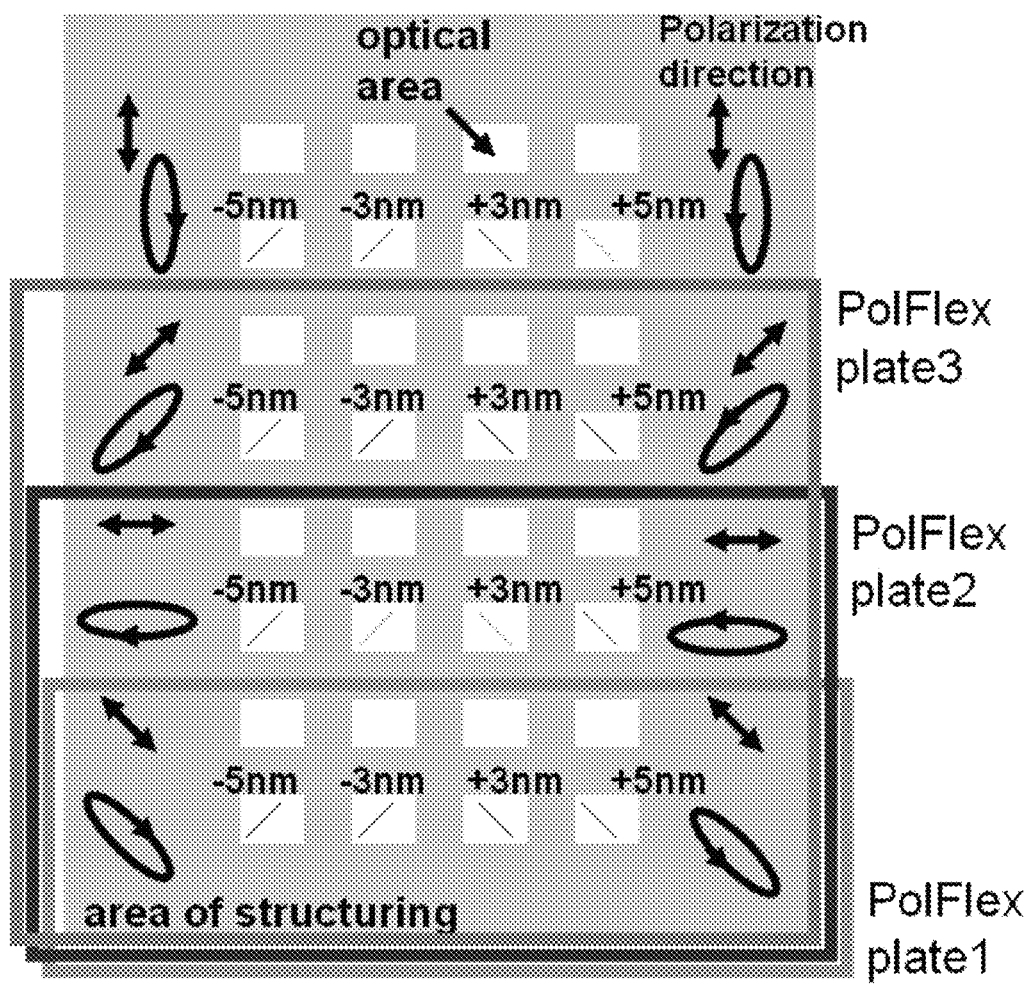
FIG. 11 schematically represents the combination of three polarization plates and a first compensation plate in a portion of the channel matrix.
Figure 12:
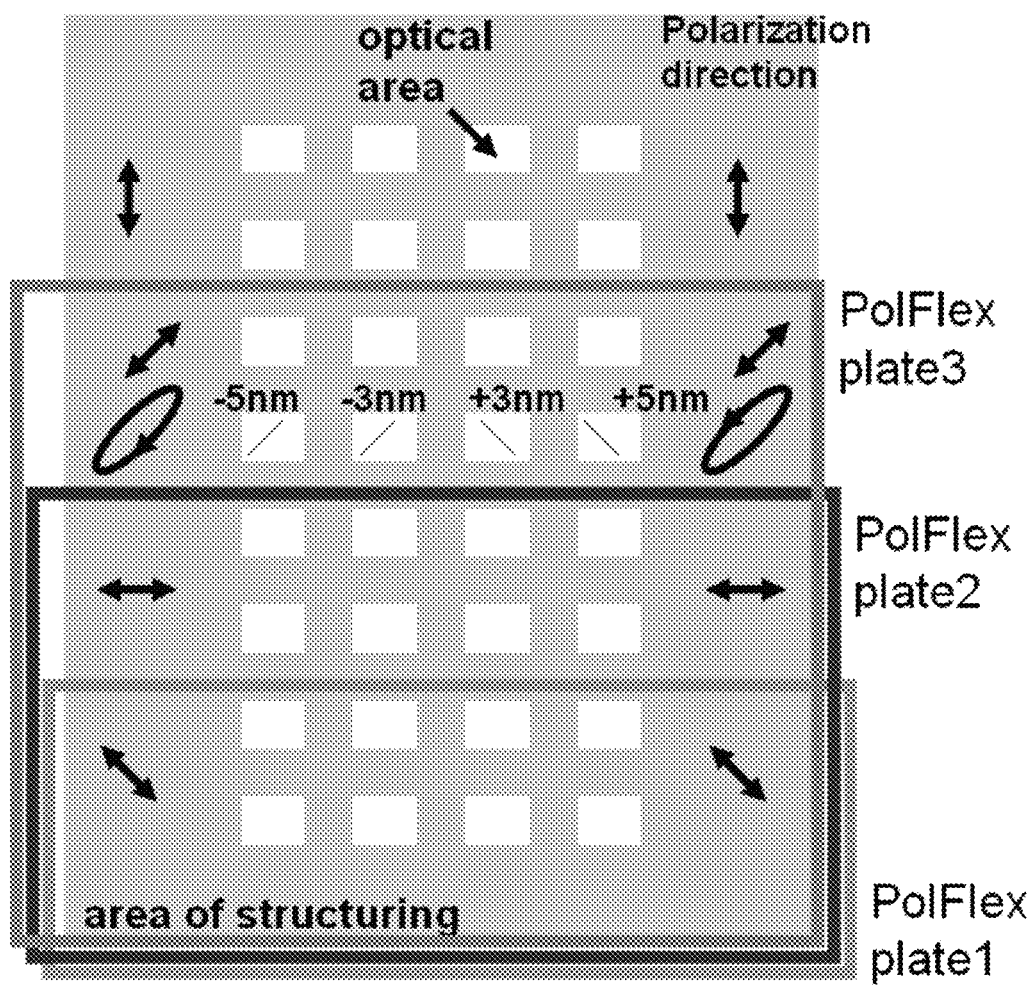
FIG. 12 schematically shows the combination of three polarization plates and a second compensation plate in a portion of a channel matrix.
Figure 1:
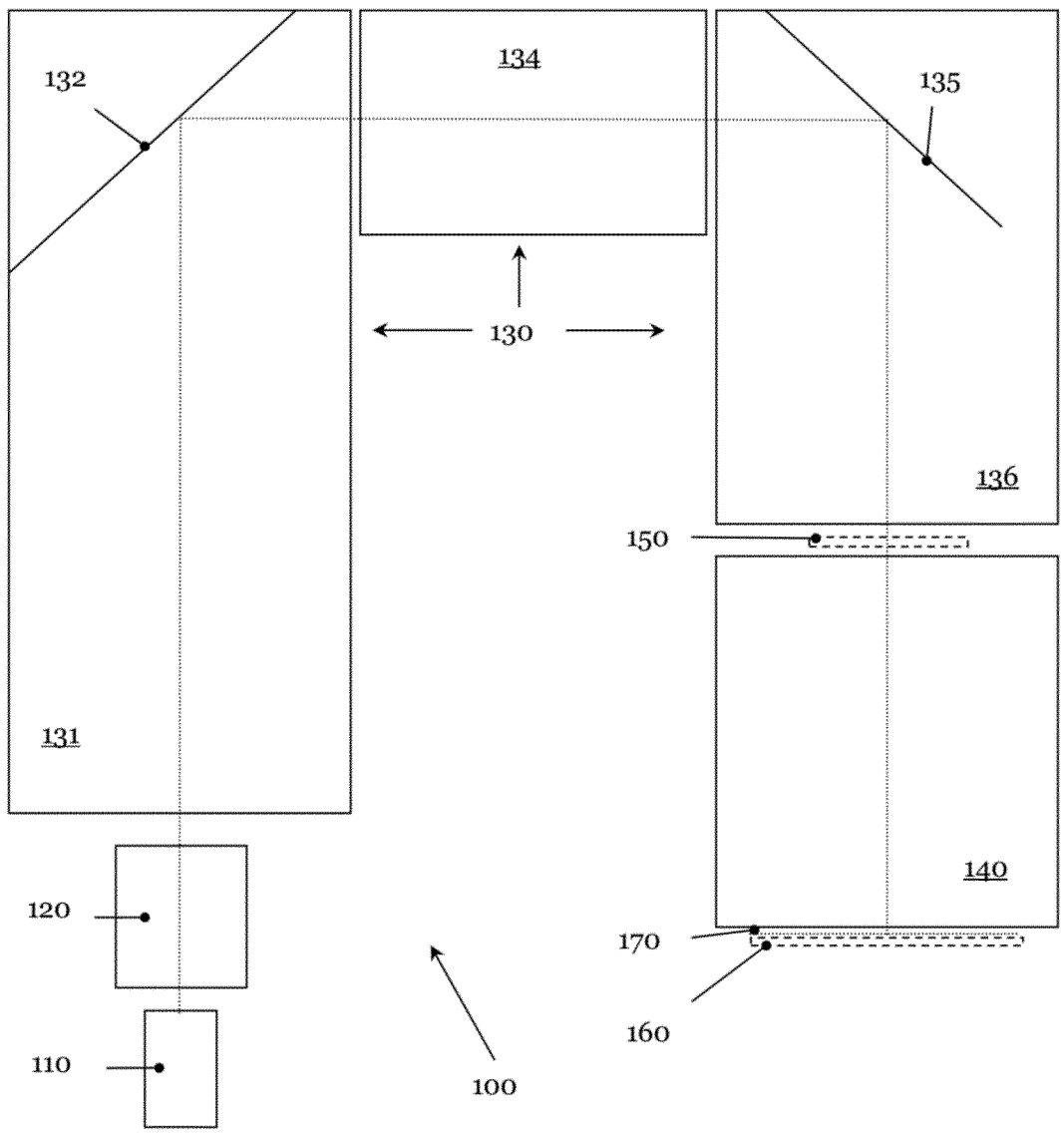
Figure 2:
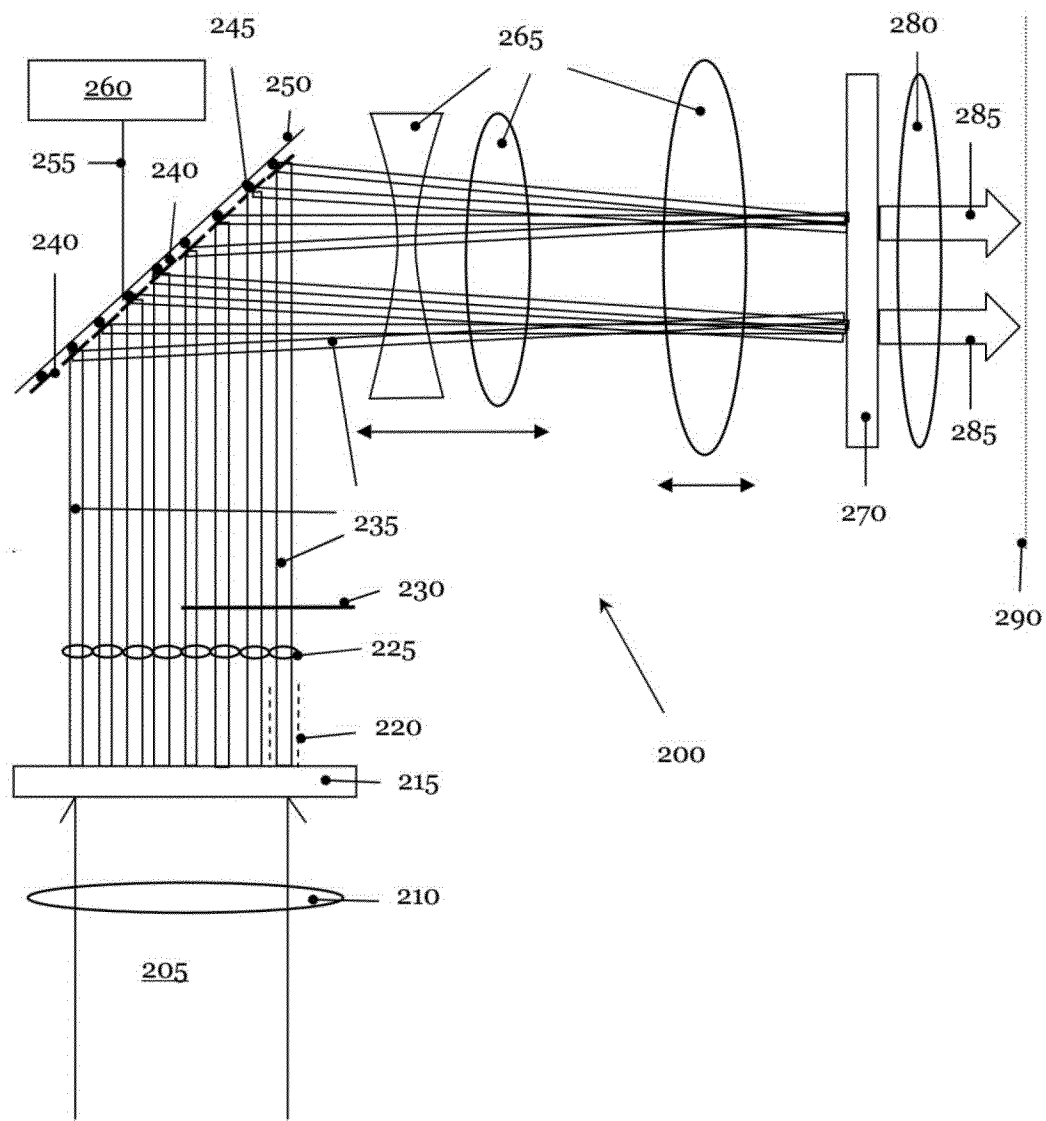
Figure 3A:
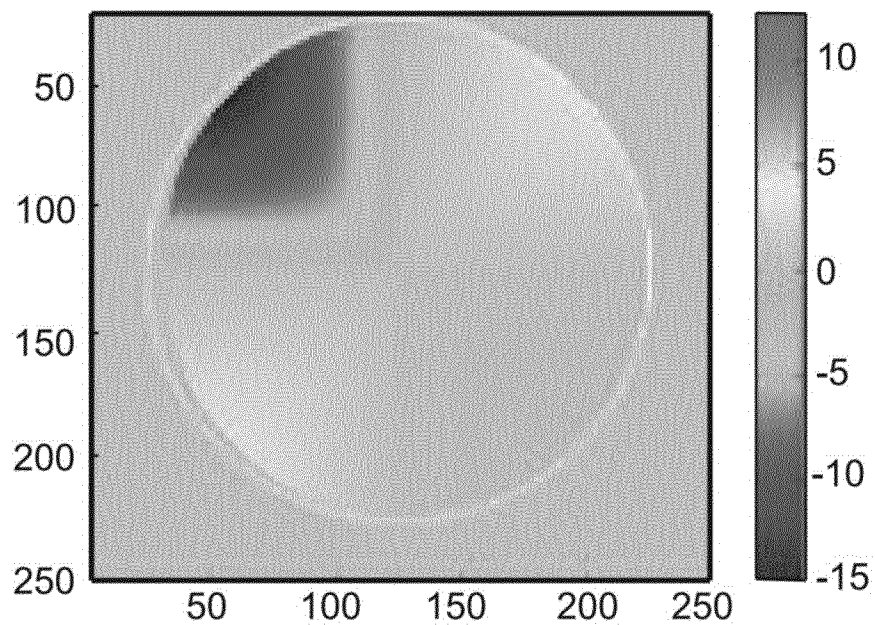
Figure 3B:
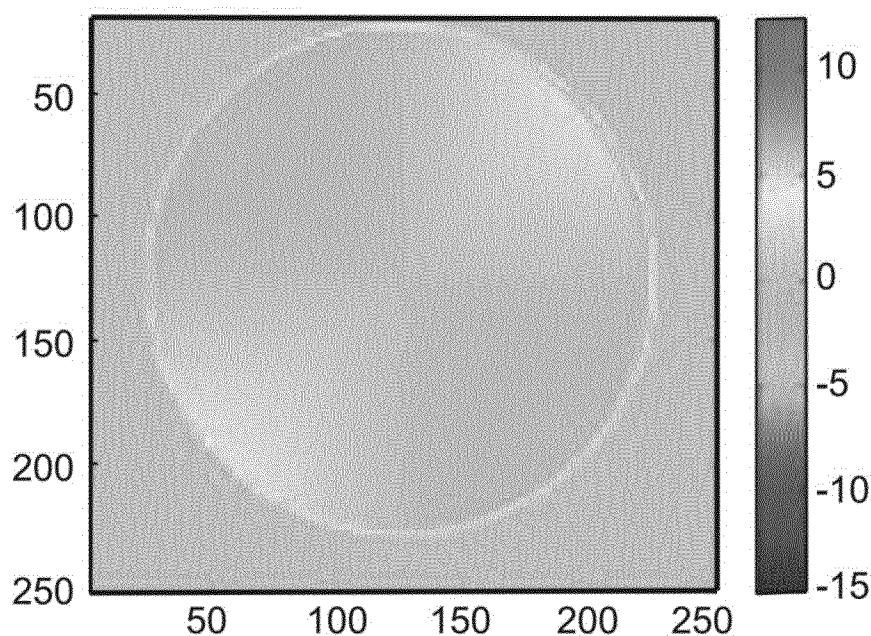
Figure 3C:
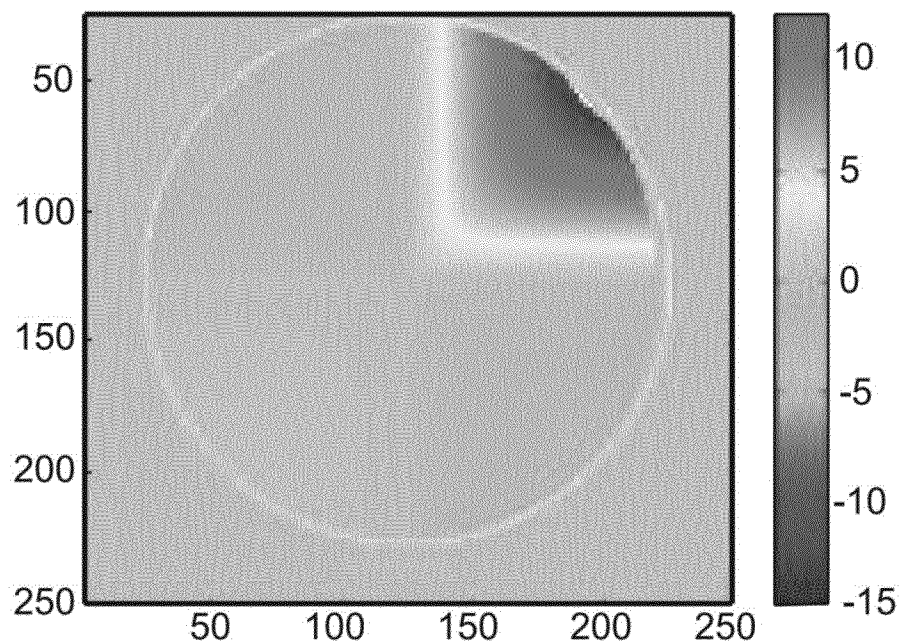
Figure 4:
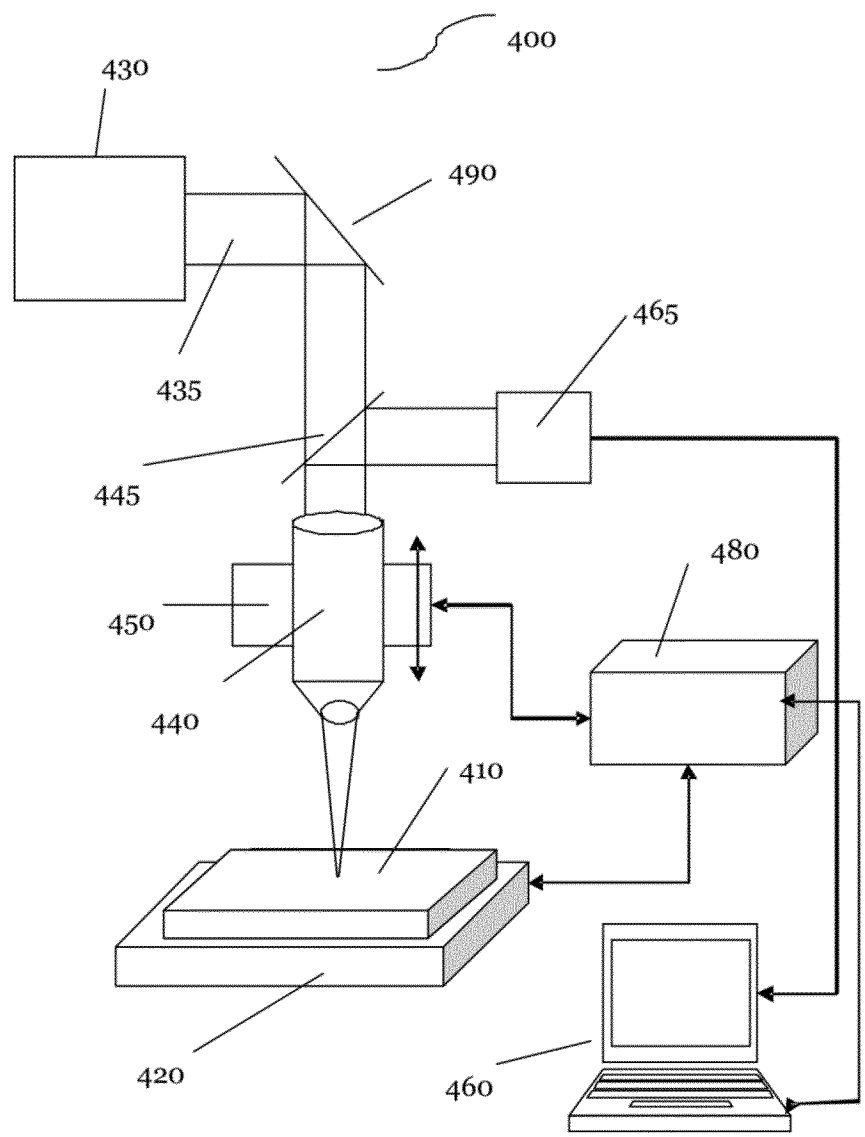
Figure 5:
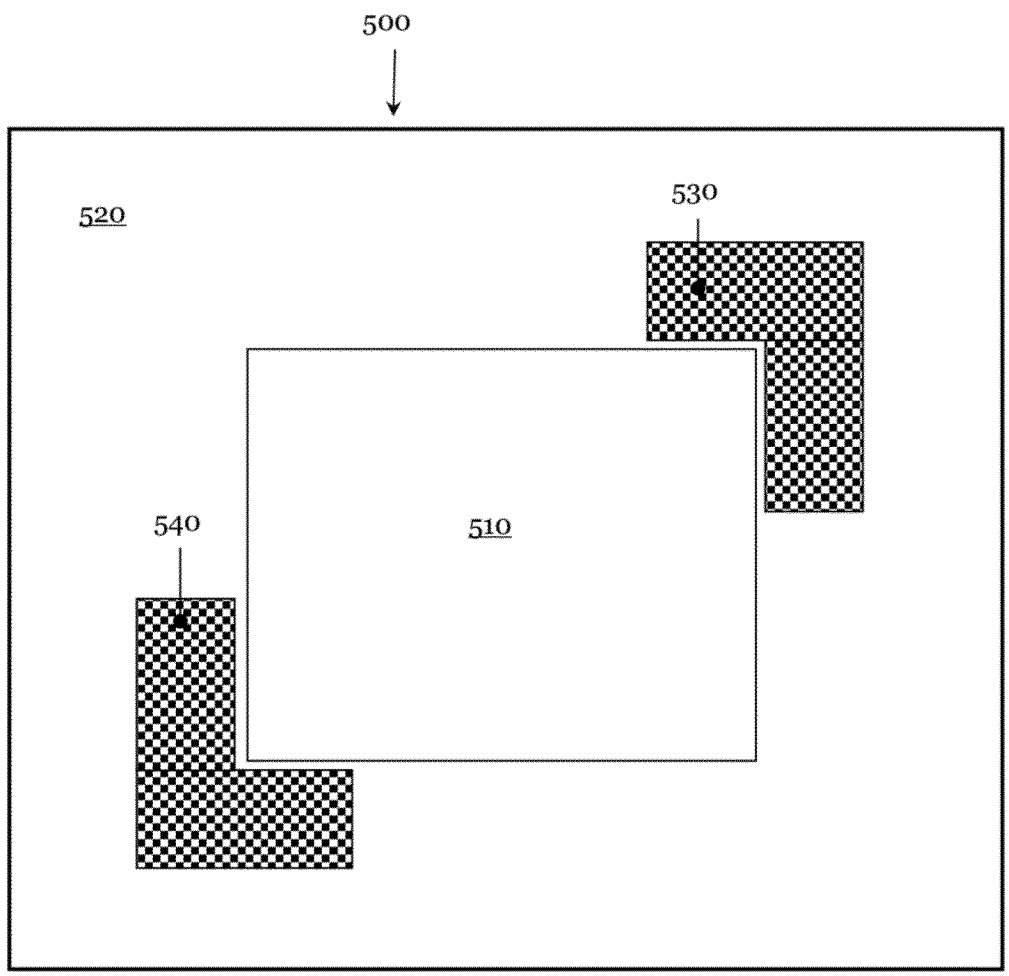
Figure 6:
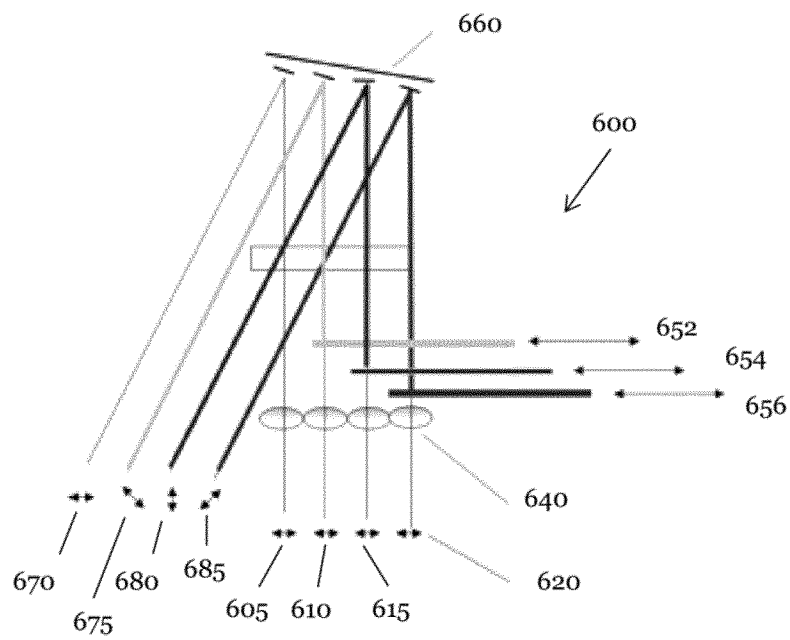
Figure 7:
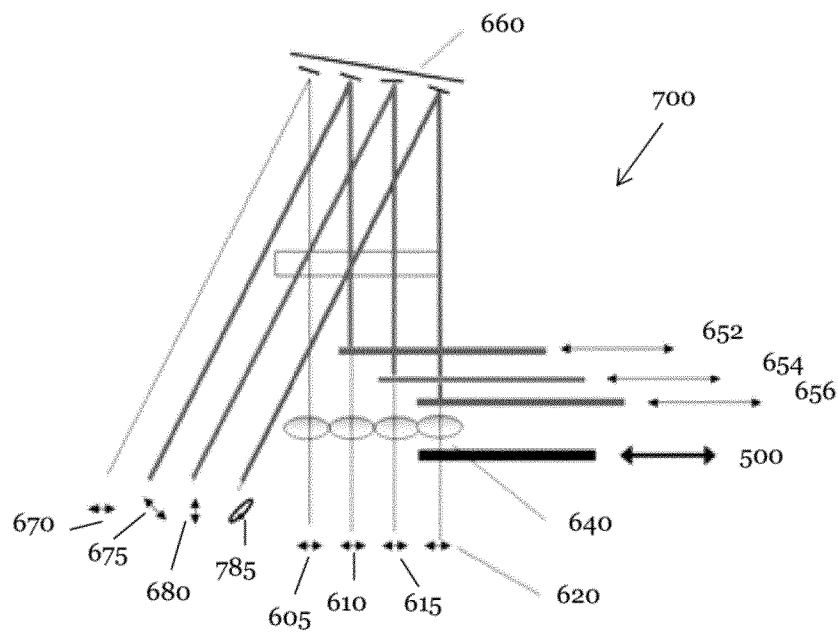
Figure 8:
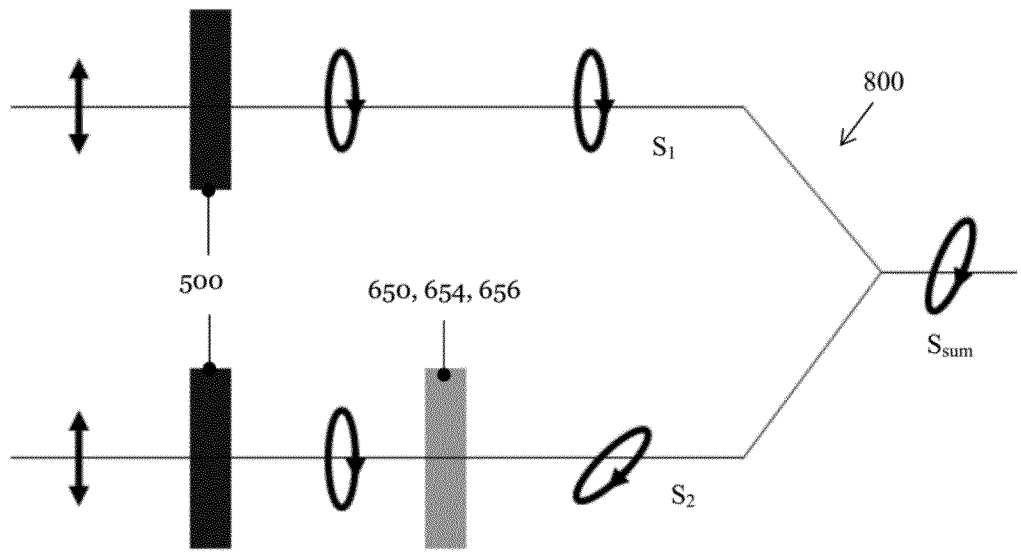
Figure 9:
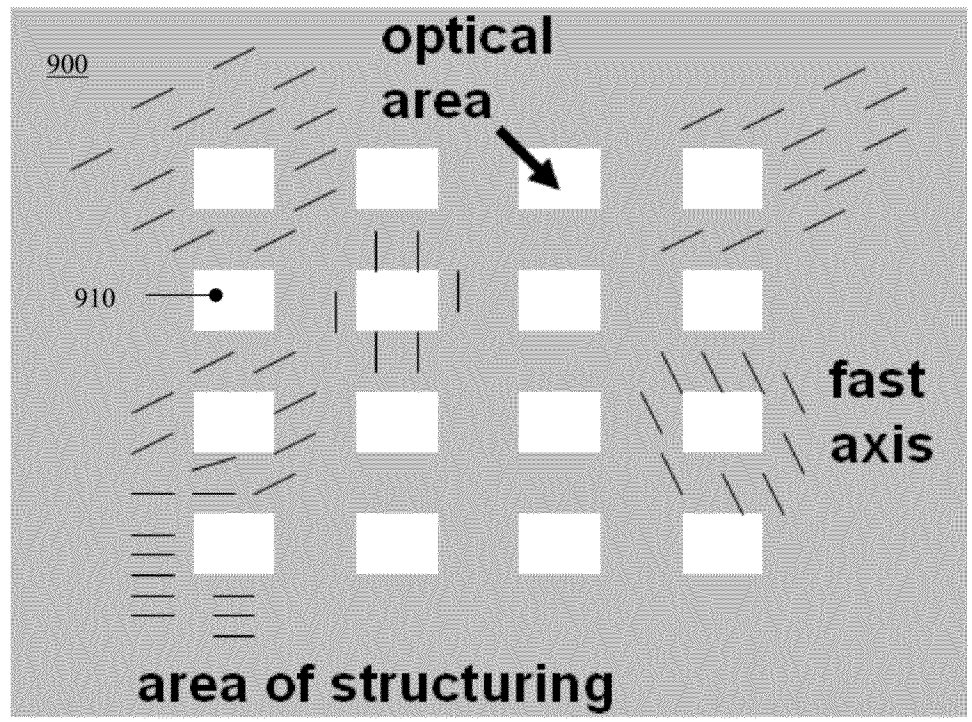

FIG. 11 shows an example in which a compensation plate having twice the configuration of FIG. 10B is used in combination with three polarization plates (PolFlex plate 1 to PolFlex plate 3) for a partial channel matrix. In this configuration, there are channels 220 for each polarization state which correct the birefringence of the respective channel, i.e. channels 220 having a fast axis of +45° and −45° as well as retardations of 3 nm and 5 nm for each fast axis orientations. There are also some channels 220 which do not have any effect on the polarization of the respective polarization state. Consequently, the retardation of the partial beams 235 forming an exiting beam generated from a superposition of the partial beams 235 of this portion of the channel matrix can very largely be compensated.

FIG. 12 again presents an example with three polarization plates (PolFlex plate1 to PolFlex plate 3) and a compensation plate. In contrast to the example of FIG. 11, the compensation plate having once the configuration of FIG. 10A is used to compensate the retardation effect of various channels of the presented channel matrix cut-out. In order to optimize the compensation of the polarization variation of the channels 220 of the partial channel matrix, the compensation plate is dynamically moved within the channel matrix cut-out of FIG. 12. The movement of the compensation plate is independent from the polarization plates.

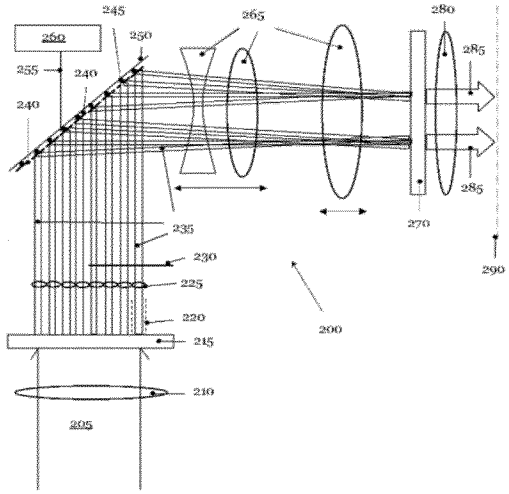

The invention claimed is:

1. An illumination system configured so that, during use of the illumination system, the illumination system guides a plurality of partial beams of light, each partial beam of light having a corresponding channel, the illumination system comprising:
an optical element,
wherein:
the optical element comprises local persistent modifications in an area of the optical element outside an optically relevant area of the optical element;
the local persistent modifications in the optical element produce a strain-induced birefringence in the optical element;
the optical element is configured so that, during use of the illumination system;
a) the partial beam of light in a first channel impinges on the optical element; and
b) the strain-induced birefringence of the optical element at least partially compensates a variation of a polarization of the partial beam of light of the first channel; and
the illumination system is a microlithographic illumination system.

2. The illumination system of claim 1, wherein the optical element is configured so that, during use of the illumination system, the optical element modifies the polarization of the partial beam of light of the first channel.

3. The illumination system of claim 1, further comprising a mirror array comprising a first mirror, wherein the first mirror is configured so that, during use of the illumination system, the first mirror directs a partial beam passing through the optical element in an outer edge of a pupil in agreement with a predetermined target pupil.

4. The illumination system of claim 1, wherein the strain induced birefringence of the optical element comprises a fast axis having a fixed direction.

5. The illumination system of claim 1, wherein the strain induced birefringence of the optical element comprises a retardation of from one nanometer to 10 nanometers in the optically relevant area of the optical element.

6. The illumination system of claim 5, wherein the optical element is configured so that, during use of the illumination system, the optical element maximizes a modification of the polarization of the partial beam of light of the first channel based on an orientation of a fast axis of the optical element with respect to the polarization of the partial beam of light of the first channel.

7. The illumination system of claim 1, wherein:
the illumination system comprises a two dimensional mirror array comprising a plurality of mirrors; and
each mirror of the plurality of mirrors of the two dimensional mirror array is tiltable about two axes so that, during use of the illumination system, the partial beams of light of the first channel is superimposed with a partial beam of light of second channel in a single spot so that a retardation of the superimposed partial beams of light compensates retardation of the illumination system.

8. The illumination system of claim 7, wherein, during use of the illumination system, the polarization of the partial beam of light of the first channel is rotated with respect to the polarization of the partial beam of light of the second channel.

9. The illumination system of claim 1, wherein, during use of the illumination system, compensating the variation of the polarization of the partial beam of light of the first channel increases an intensity in preferred state of a beam exiting the illumination system.

10. The illumination system of claim 1, wherein the optical element comprises an actuator configured to induce strain in the optically relevant area of the optical element.

11. The illumination system of claim 1, wherein, during use of the illumination system, the optical element is dynamically insertable in the first channel.

12. The illumination system of claim 1, wherein the optical element comprises a multitude of optical elements having different fixed fast axes and/or different amounts of retardations.

13. The illumination system of claim 12, wherein the multitude of optical elements is configured so that, during use of the illumination system, the multitude of optical elements is insertable in a multitude of the channels, each one having a defect so that an intensity in a preferred state of the beam exiting the illumination system is maximized.

14. The illumination system of claim 1, wherein the optical element comprises a polarizer configured to change a polarization of the partial beam of light of the first channel.

15. The illumination system of claim 1, wherein the at least one optical element comprises a mirror for reflecting the partial beam.

16. The illumination system of claim 1, wherein the at least one optical element comprises a lens for deflecting the partial beam.

17. The illumination system of claim 1, wherein the optical element comprises a plate, the plate has a first optically relevant area for the first channel, the plate has a second optically relevant area for a second channel, and the first and second optically relevant areas are between areas of the plate which are optically not relevant.

18. The illumination system of claim 17, wherein the first and second optically relevant areas:
are arranged in a one-dimensional row or are arranged in a two-dimensional rectangular matrix;
have a diameter which is adjustable to a diameter of the partial beams of the first and second channels; and
have a distance which is adjustable to a distance between the partial beam of light each of the first and second channels.

19. The illumination system of claim 17, wherein the plate comprises at least two optically relevant areas configured to compensate at least two different defects.

20. The illumination system of claim 17, wherein the first and second optically relevant areas of the plate comprise a polarizer configured to change a polarization of the partial beam of each of the first and second channels.

21. The illumination system of claim 17, wherein the plate is moveable essentially perpendicular to directions of the partial beams of light of the first and second channels, and/or the plate is rotatable essentially perpendicular to directions of the partial beams of light of the first and second channels.

22. The illumination system of claim 17, wherein, during use of the illumination system, the plate is dynamically insertable in a beam path of the partial beams of the first and second channels.

23. The illumination system of claim 1, wherein the illumination system is configured so that, during use of the illumination system, ultra-short laser pulses introduce the local persistent modifications of the optical element.

24. An apparatus, comprising:
an illumination system according to claim 1; and
a projection objective,
wherein the apparatus is a microlithographic projection exposure apparatus.

25. A method comprising:
using an illumination system of claim 1 to illuminate a mask; and
using a projection objective to image at least a portion of the mask onto a photosensitive material.

26. The method of claim 25, further comprising using the first optical element to compensate for the variation of the polarization of the partial beam of light of the first channel.

27. The method of claim 26, further comprising inserting the optical element into the first channel.

28. The illumination system of claim 1, wherein a local persistent modification of the optical element is a local modification of a density of the optical element.

\* \* \* \* \*

UNITED STATES PATENT AND TRADEMARK OFFICE
CERTIFICATE OF CORRECTION

PATENT NO. : 9,632,413 B2
APPLICATION NO. : 14/466053
DATED : April 25, 2017
INVENTOR(S) : Ingo Saenger and Frank Schlesener Page 1 of 13

It is certified that error appears in the above-identified patent and that said Letters Patent is hereby corrected as shown below:

On the Title Page

Delete the title page and substitute therefore with the attached title page consisting of the corrected illustrative figure.

In the Drawings

Please replace FIGS. 1-12 with FIGS. 1-12 as shown on the attached pages.

In the Specification

Column 1, Line 59: Delete "inhomogenity" and insert -- inhomogeneity --, therefor.

Column 2, Line 14 (approx.): Delete "semiconducing" and insert -- semiconducting --, therefor.

Column 2, Line 52: After "733 A1", insert -- . --.

Column 6, Line 13 (approx.): Delete "micolithographic" and insert -- microlithographic --, therefor.

Column 17, Line 8: Delete "that that" and insert -- that --, therefor.

In the Claims

Column 19, Line 19: In Claim 1, delete "system;" and insert -- system: --, therefor.

Signed and Sealed this
Ninth Day of July, 2019

Andrei Iancu
*Director of the United States Patent and Trademark Office*

(12) United States Patent
Saenger et al.

(10) Patent No.: US 9,632,413 B2
(45) Date of Patent: Apr. 25, 2017

(54) APPARATUS AND METHOD FOR COMPENSATING A DEFECT OF A CHANNEL OF A MICROLITHOGRAPHIC PROJECTION EXPOSURE SYSTEM

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 342 days.

(21) Appl. No.: 14/466,053

(22) Filed: Aug. 22, 2014

(65) Prior Publication Data
US 2015/0017589 A1    Jan. 15, 2015

Related U.S. Application Data

(63) Continuation of application No. PCT/EP2012/055621, filed on Mar. 29, 2012.

(51) Int. Cl.
| | |
|---|---|
| *G03B 27/54* | (2006.01) |
| *G03B 27/72* | (2006.01) |
| *G03F 7/20* | (2006.01) |
| *G02B 5/30* | (2006.01) |

(52) U.S. Cl.
CPC ......... *G03F 7/2006* (2013.01); *G02B 5/3083* (2013.01); *G03F 7/20* (2013.01); *G03F 7/70116* (2013.01); *G03F 7/70191* (2013.01); *G03F 7/70425* (2013.01); *G03F 7/70566* (2013.01)

(58) Field of Classification Search
CPC ............. G03F 7/70966; G03F 7/70116; G03F 7/70425; G03F 7/70566
USPC .................................... 355/53, 67–71
See application file for complete search history.

(56) References Cited

U.S. PATENT DOCUMENTS

| | | |
|---|---|---|
| 6,191,880 B1 | 2/2001 | Schuster |
| 7,525,639 B2 | 4/2009 | Yamada |
| 8,537,332 B2 | 9/2013 | Freimann |
| 8,593,618 B2 | 11/2013 | Totzeck |
| 8,711,479 B2 | 4/2014 | Fiolka et al. |

(Continued)

FOREIGN PATENT DOCUMENTS

| | | |
|---|---|---|
| CN | 1914525 A | 2/2007 |
| CN | 101589343 A | 11/2009 |

(Continued)

OTHER PUBLICATIONS

Japanese Office Action, with translation thereof, for JP Appl No. 2015-502109, dated Mar. 7, 2016.
(Continued)

*Primary Examiner* — Hung Henry Nguyen
(74) *Attorney, Agent, or Firm* — Fish & Richardson P.C.

(57) ABSTRACT

The invention relates to an illumination system of a microlithographic projection exposure apparatus comprising (a) a plurality of channels, each channel guiding a partial beam and at least one channel comprising at least one defect, and (b) at least one optical element arranged within the at least one channel having the at least one defect, the optical element being adapted to at least partially compensate the at least one defect of the partial beam of the channel.

28 Claims, 11 Drawing Sheets
(2 of 11 Drawing Sheet(s) Filed in Color)